US012514028B2

(12) United States Patent
Fonash

(10) Patent No.: US 12,514,028 B2
(45) Date of Patent: Dec. 30, 2025

(54) NANO-SCALE LIGHT INTENSITY CONCENTRATION CONTROL

(71) Applicant: Stephen J. Fonash, State College, PA (US)

(72) Inventor: Stephen J. Fonash, State College, PA (US)

(*) Notice: Subject to any disclaimer, the term of this patent is extended or adjusted under 35 U.S.C. 154(b) by 27 days.

(21) Appl. No.: 17/182,810

(22) Filed: Feb. 23, 2021

(65) Prior Publication Data

US 2021/0305447 A1 Sep. 30, 2021

Related U.S. Application Data

(63) Continuation-in-part of application No. 15/337,590, filed on Oct. 28, 2016, now Pat. No. 10,930,803, which is a continuation-in-part of application No. 15/223,545, filed on Jul. 29, 2016, now Pat. No. 10,991,839.

(60) Provisional application No. 62/210,848, filed on Aug. 27, 2015, provisional application No. 62/198,136, filed on Jul. 29, 2015.

(51) Int. Cl.
*H10F 77/42* (2025.01)
*H10F 77/40* (2025.01)

(52) U.S. Cl.
CPC ......... *H10F 77/484* (2025.01); *H10F 77/413* (2025.01)

(58) Field of Classification Search
CPC ........... H10F 77/70–707; H10F 77/484; H10F 77/413; H10F 77/143; H10F 77/244–254; H10F 77/1437; H10F 77/147; H10F 77/148; H10F 77/48; H10F 19/30–37; H10F 10/17
See application file for complete search history.

(56) References Cited

U.S. PATENT DOCUMENTS

| | | | |
|---|---|---|---|
| 8,216,872 B1* | 7/2012 | Shieh | H01L 31/056 438/69 |
| 2010/0206362 A1 | 8/2010 | Flood | |

(Continued)

OTHER PUBLICATIONS

Fonash et al, A Solar Cell Architecture for Enhancing Performance While Reducing Absorber Thickness and Back Contact Requirements, IEEE Journal of Photovoltaics, vol. 7, No. 4, Jul. 2017 (Year: 2017).*

(Continued)

*Primary Examiner* — Andrew J Golden
(74) *Attorney, Agent, or Firm* — MaxGoLaw PLLC

(57) ABSTRACT

A photovoltaic or light detecting device is provided that includes a periodic array of dome or dome-like protrusions at the light impingement surface and three forms of reflector/back electrode at the device back. The beneficial interaction between an appropriately designed top protrusion array and these reflector/electrode back contacts (R/EBCs) serve (1) to refract the incoming light thereby providing photons with an advantageous larger momentum component parallel to the plane of the back (R/EBC) contact and (2) to provide optical impedance matching for the short wavelength incoming light. The reflector/back electrode operates as a back light reflector and counter electrode to the periodic array of dome or dome-like structures. A substrate supports the reflector/back electrode.

21 Claims, 28 Drawing Sheets
(25 of 28 Drawing Sheet(s) Filed in Color)

(56) References Cited

U.S. PATENT DOCUMENTS

| | | | |
|---|---|---|---|
| 2011/0277827 A1* | 11/2011 | Yang | H01L 31/0392 257/E31.13 |
| 2011/0308586 A1 | 12/2011 | Yamazaki | |
| 2012/0125437 A1 | 5/2012 | Okawara et al. | |
| 2012/0240999 A1 | 9/2012 | Yoshida et al. | |
| 2013/0092210 A1* | 4/2013 | Fonash | H01L 31/035227 977/948 |
| 2013/0092229 A1 | 4/2013 | Xue et al. | |
| 2013/0112236 A1 | 5/2013 | Bhan et al. | |
| 2013/0192663 A1* | 8/2013 | Fonash | H01L 31/02363 136/246 |
| 2013/0220406 A1 | 8/2013 | Day et al. | |
| 2014/0252313 A1 | 9/2014 | Mariani et al. | |
| 2014/0261612 A1 | 9/2014 | Smith et al. | |

OTHER PUBLICATIONS

Nguyen-Huu et al, "Investigation of optical absorptance of one-dimensionally periodic silicon gratings as solar absorbers for solar cells," Opt. Express 22, A68-A79 (2014) (Year: 2014).*

Wagner et al, Integrated series/parallel connection for photovoltaic laser power converters with optimized current matching, Prog Photovolt Res Appl. 2021;29:172-180 (Year: 2020).*

Sheppard, C.J.R, "Approximate calculation of the reflection coefficient from a stratified medium", Pure and Applied Optics: Journal of the European Optical Society Part A (1995), pp. 665-669, vol. 4, Issue 5, Copyright IOP Publishing Ltd. (1995).

Haug, F.J. et al., "Influence of the ZnO buffer on the guided mode structure in Si/ZnO/Ag multilayers", Journal of Applied Physics, Sep. 2009 (Published Online: Aug. 19, 2009), pp. 044502-1-044502-7, vol. 106, Copyright American Institute of Physics (2009).

Fonash, Stephen, "Solar Cell Device Physics; 2nd Edition", Published Apr. 13, 2010, Copyright Academic Press and Elsevier Inc. (2010).

Ferry, V.E., Polman, A., Atwater, H.A., "Modeling Light Trapping in Nanostructured Solar Cells", ACS Nano, Dec. 27, 2011 (Published Online: Nov. 14, 2011), pp. 10055-10064, vol. 5, Issue 12, Copyright American Chemical Society (2011).

Nam, Wook Jun et al., "Exploration of nano-element array architectures for substrate solar cells using an a-Si:H absorber", Journal of Applied Physics, Published Online: Jun. 19, 2012, pp. 123103-1-123103-6, vol. 111, Copyright American Institute of Physics (2012).

Kim, Jeehwan et al., "9.4% Efficient Amorphous Silicon Solar Cell on High Aspect-Ratio Glass Microcones", Advanced Materials, Jun. 25, 2014 (Published Online: Mar. 20, 2014), pp. 4082-4086, vol. 26, Issue 24, Copyright Wiley-VCH Verlag Gmbh & Co. KGaA, Weinheim (2014).

* cited by examiner

LCCM device: Dome structure and planar region with nc-Si absorber active regions. AZO front layer, AZO buffer, and Ag back conductor. Without a nanoelement.

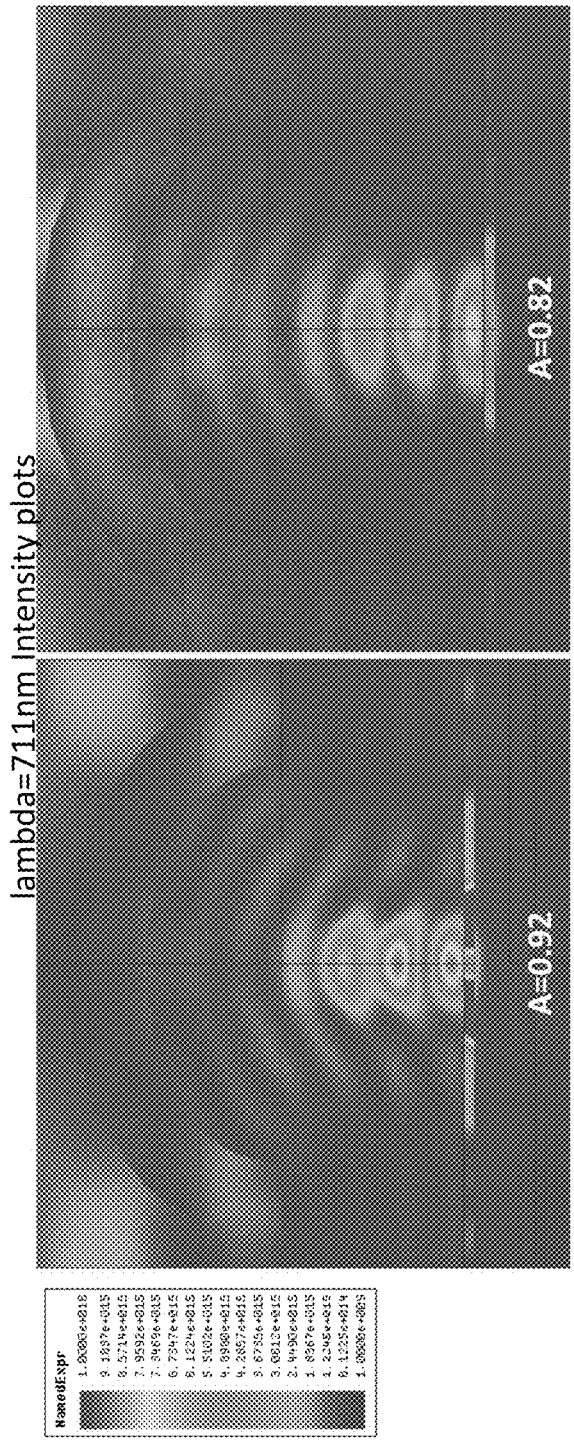
LCCM Devices: nc-Si with buffer, without nanoelement for two different planar active region thicknesses (362 and 400nm).
FIG. 9a  LCCM with buffer for t = 362nm
FIG. 9b  LCCM with buffer for t = 400nm

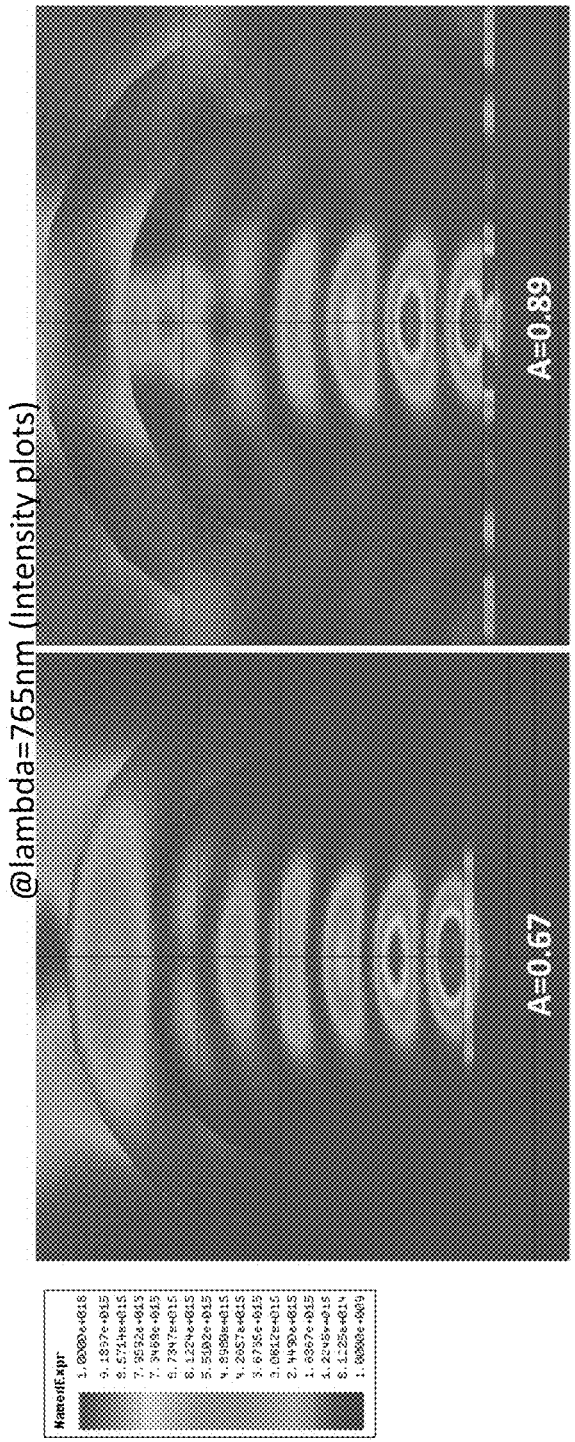

LCCM devices: nc-Si cells w/o nanoelement. (a) without buffer and (b) with buffer both for planar active region thicknesses of 400nm @lambda=920nm (Intensity plots)

LCCM w/o buffer and w/o nanoelement
For t = 400nm

LCCM w buffer w/o nanoelement
For t = 400nm

LCCM device: The architecture of FIG. 8 but with the addition of a coated polyimide nanoelement

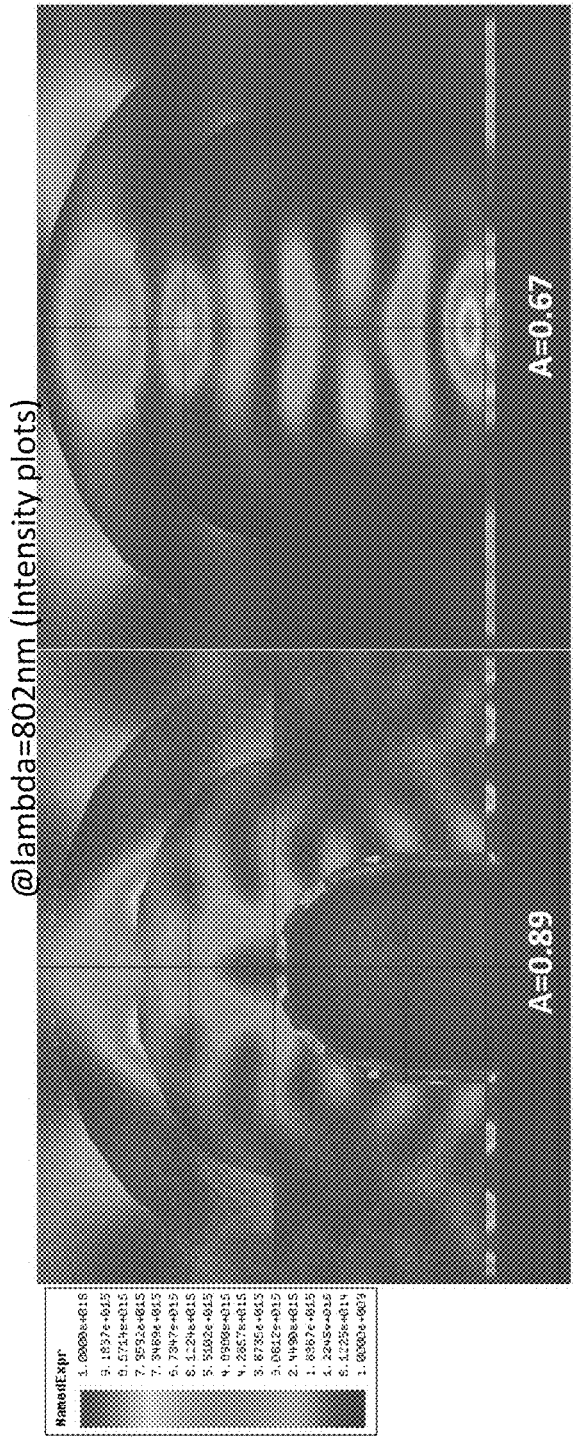
LCCM devices: nc-Si cell with back buffer and with/without coated PI nanoelement
FIG. 17a  LCCM: w buffer and nanoelement. There is no buffer on the nanoelement. For λ = 400nm
FIG. 17b  LCCM: w buffer w/o nanoelement. For λ = 400 nm

NANO-SCALE LIGHT INTENSITY CONCENTRATION CONTROL

RELATED APPLICATIONS

This application is a non-provisional application that is a continuation-in-part of U.S. Non-Provisional application Ser. No. 15/337,590 filed Oct. 28, 2016 that in turn claims priority benefit and is a continuation-in-part of U.S. Non-Provisional application Ser. No. 15/223,545 filed Jul. 29, 2016 that in turn claims priority benefit of U.S. Provisional Application Ser. No. 62/198,136 filed Jul. 29, 2015; and U.S. Provisional Application Ser. No. 62/210,848 filed Aug. 25, 2015; the content of both of which are hereby incorporated by reference.

FIELD OF THE INVENTION

The present invention relates in general to photovoltaic (e.g., solar cell) or light detecting devices and in particular to a protrusion array—reflector/back electrode structure performing an optical refraction/reflection function thereby affording superior performance as measured by effectiveness, cost, or both.

BACKGROUND OF THE INVENTION

Solar cells traditionally have normally resorted to structures having textured (usually random) front surfaces and metal layer(s) back reflector/electrode structures to serve generally in both electrical conduction and optical roles (1). Metals have the advantage in the back of being able to serve as both reflector and conducting back electrode. Because of its excellent reflectivity, conductivity, and chemical properties, silver is usually the metal of choice for the reflector/electrode back contact (R/EBC) use. However, the cost of silver can be a factor, especially in large device area applications such as solar cells. The processing step needed to apply a back reflector/electrode metal can also be time-consuming and costly, especially if it involves vacuum deposition. In these devices effectiveness as well as materials and manufacturing costs, or both are factors to be considered. The back reflector/electrode structure that would be very useful is one that would not degrade performance to any significant extent, if at all, when utilized and yet would avoid the use of an expensive metal thereby being beneficial by mitigating device cost considerations, removing metal chemical reactivity considerations, removing plasmonic loss possibilities (2-4), and simplifying processing. Such a back reflector/electrode structure employed as part of an architecture that also avoided the use of front texturing for light management would be excellent. Eliminating texturing, which often involves chemical etching or random surface growth, would improve processing. Thus, there exists a need for a solar cell architecture that is free of an expensive metal layer performing an optical reflector function and free of the use of texturing.

In recent work, Kim et al. (4) used a 200 nm ZnO:Al back contact for a superstrate with Si:H thin film solar cell on glass microcone features on a glass substrate. Here the notation ZnO:Al represents Al doped ZnO (commonly denoted as AZO). The microcones with a base diameter D ~1.5 μm were formed by employing a hard mask on, and then reactive ion etching (RIE), the glass substrate. These randomly positioned microcones were reported to have an aspect ratio A~2 where this aspect ratio for microcones was defined as A=H/D, where H is the microcone height and D is its base dimension. Kim et al. termed A=H/D≥2 a high aspect ratio and their ~2 microcones to be 3-D features (4). To explore increasing the performance of these superstrate cells, Kim et al added a back-reflector (BR) on the back of their solar cells. This BR was of the form of a ZnO:Al/Ag BR for some cells and of the form ZnO:Al/TiO BR for others. In this latter BR case, the TiO was in the form of nanoparticles. Performance of the ZnO:Al/Ag BR and ZnO:Al/(nanoparticle) TiO BR structures was compared to what they termed the "none BR ZnO:Al [AZO] back contact". It was found that the ZnO:Al/(nanoparticle) TiO BR structure performed the best and the "none BR ZnO:Al [AZO] back contact" was the next best. Devices with the ZnO:Al/(nanoparticle) TiO BR were reported to give about 5% more short circuit current than the none BR ZnO:Al [AZO] back contact (4).

SUMMARY OF THE INVENTION

A photovoltaic or light detecting device is provided that includes a periodic array of dome or dome-like protrusions at the light impingement (front) surface and one of three reflector/back electrode designs at the device back (or rear). The beneficial interaction between an appropriately designed top protrusion array and these reflector/electrode back contacts (R/EBCs) serves (1) to refract the incoming light in a manner to thereby provide photons with an advantageous larger momentum component parallel to the plane of the back (R/EBC) contact and (2) to provide optical impedance matching for the short wavelength incoming light. Each reflector/back electrode form operates as a back light reflector and counter electrode to the periodic array of dome or dome-like structures. A substrate supports the reflector/back electrode.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present invention is further detailed with respect to the following drawings. These drawings are not intended to limit the scope of the appended claims, but rather to illustrate specific embodiments thereof. These drawings are not necessarily to scale.

FIGS. 9(a) and 9(b) illustrate intensity distributions resulting in and around the structure of FIG. 8 without a nanoelement due to the normal impingement of sunlight (e.g., AM1.5) with a wavelength of 711 nm using a high-frequency structure simulator (HFSS) code for (a) planar active region thickness of 362 nm, and (b) planar active region thickness of 400 nm;

FIGS. 10(a) and 10(b) illustrate intensity distributions resulting in and around the structure of FIG. 8 without a nanoelement due to the normal impingement of sunlight (e.g., AM1.5) with a wavelength of 765 nm using a high-frequency structure simulator (HFSS) code for (a) planar active region thickness of 362 nm, and (b) planar active region thickness of 400 nm;

FIGS. 11(a) and 11(b) illustrate intensity distributions resulting in and around the structure of FIG. 8 without a nanoelement due to the normal impingement of sunlight (e.g., AM1.5) with a wavelength of 872 nm using a high-frequency structure simulator (HFSS) code for (a) planar active region thickness of 362 nm, and (b) planar active region thickness of 400 nm;

FIGS. 17(a) and 17(b) illustrate intensity distributions resulting in and around the structure of FIG. 8 with a back buffer with and without a nanoelement due to the normal impingement of sunlight (e.g., AM1.5) with a wavelength of 802 nm using a high-frequency structure simulator (HFSS) code for (a) LCCM with a buffer and nanoelement and a thickness of 400 nm, and (b) LCCM with a buffer and no nanoelement and a thickness of 400 nm;

DESCRIPTION OF THE PREFERRED EMBODIMENTS

Figure 1A:
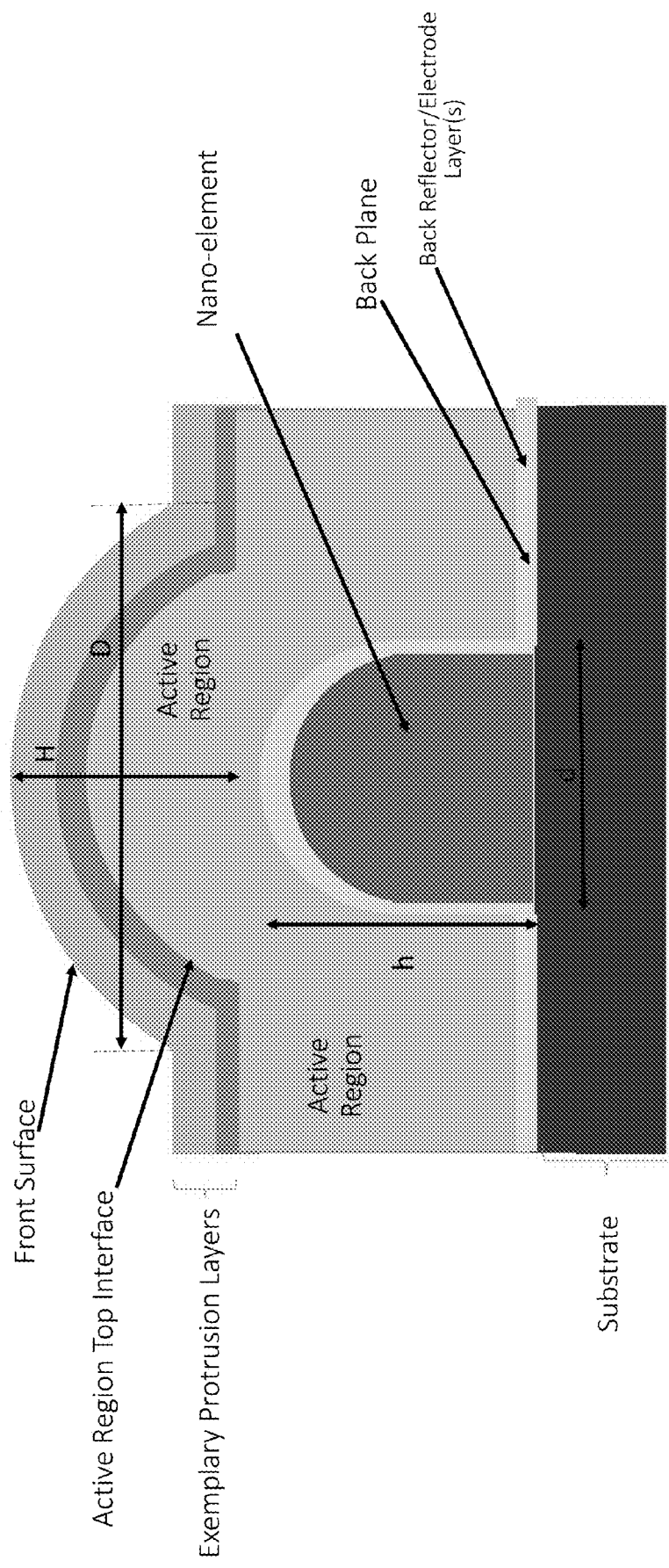
FIG. 1(a) is a schematic cross-sectional view of an inventive embodiment in which nanoelements underlying each one of a periodic array of dome or dome-like protrusions are embedded within an active region.

The following detailed description is merely exemplary in nature and is in no way intended to limit the scope of the invention, its application, or uses, which may vary. The invention is described with relation to the non-limiting definitions and terminology included herein. These definitions and terminology are not designed to function as a limitation on the scope or practice of the invention, but are presented for illustrative and descriptive purposes only.

Various terms used throughout the specification and claims are defined as set forth below as it may be helpful to an understanding of the invention.

A metal-less back reflector/electrode for photovoltaic and light detection devices of the substrate configuration based on transparent conductive materials (TCMs) is one in which a metal plays no significant optical role.

As used herein, "metal-less" back reflector-electrode or equivalently "metal-less" reflector-electrode back contact (R/EBC) denotes a structure (Forms (2) and (3)) wherein the one or more layers of this back reflector-electrode contact structure is devoid of any metal film having a significant optical function. The metal layer(s) normally used in back reflector/electrode structures for their optical role is (are) simply not present in Forms (2) and (3) of the invention. A metal may lie behind a metal-less R/EBC in various configurations of this invention but, if present, it has no required optical function and serves only as an electrical conduit (i.e., contact or interconnect, or both) and perhaps a structural support. Exemplary of reflector and electrode functioning metal films in Form (1) metal R/EBCs is an Ag layer which is often employed in such structures.

The phrase "front surface of a photovoltaic or light detecting device" denotes the air/device region where incoming light first impinges. Correspondingly, the other side of the device is being denoted as the back (or rear) surface. These definitions apply to both superstrate and substrate device configurations. In conventional devices, the back surface region is often designed to reflect impinging light back through the device to enhance its utilization. Bragg reflectors with their layers of non-conducting dielectrics can be used for back reflectors (1). However, metals are most commonly utilized together with randomized front texturing.

The phrase "dome-like" denotes an aspect protruding above a top planar surface, relative to the direction of normal light impingement. Each protrusion is imprinted, molded, deposited. or alternatively disposed over a nano-element "seed" having a conical, pyramidal, cylindrical, or other shaped aspect. In this latter case, the disposition technique employed (e.g., PECVD, printing, spraying, ablation) and the seed for producing the protrusion layers control the shape of the protrusion layers.

In the invention disclosed herein, a back reflector/electrode for photovoltaic and detection devices of the substrate configuration is utilized for its optical coupling to the protrusion array eliminating or minimizing plasmonic losses in Forms (1)-(3) R/EBCs. The fabrication of this back reflector/electrode for a substrate device does not use the steps of hard mask deposition and etching of Kim et al. and it is not limited to the glass substrates of Kim et al. Uniquely, the invention reported here employs periodically arrayed dome or dome-like layered protrusions which are positioned at the front surface (FIGS. 1(a)-1(d)) and layered as schematically indicated in FIG. 2 in a cross-sectional view. The resulting refraction of impinging light redirects that light as seen in FIG. 2. This redirection is due to the shape of the dome or dome-like protrusions as seen in FIG. 2 and the variation of the indices of refraction of its layers.

The shape requirement for the layers of a protrusion for beneficial redirection properties may be quantified by employing the (normalized) surface normal vector n at two successive surface points along a ray path; i.e., points 1 and 2 of FIG. 2. The shape requirement for any two successive dome or dome-like layers in a protrusion can then be stated as: the horizontal component of the normalized surface normal vector at point 2 must be equal to or larger than the horizontal component of the normalized surface normal vector at point 1. The horizontal direction is defined by the "back plane" in FIGS. 1(a)-(d). Layer indices of refraction must increase or at least remain constant as the impinging light penetrates deeper into the photovoltaic or light detecting device. The objective of this protrusion orientation being away from the device (FIGS. 1(a)-1(d)), the protrusion topology, and the varying indices of refraction is to increase the component of the impinging photon momentum parallel to the planar region (defined by the back plane) of the back electrode depicted in FIGS. 1(a)-1(d).

The fabrication of this protrusion array—back reflector/electrode architecture for a substrate device does not use steps such as hard mask deposition and etching and it is not limited to the use of glass substrates. As noted, the invention reported here employs "dome protrusions" or "dome-like protrusions" which are positioned at the front surface as schematically indicated in FIGS. 1(a) and 1(b) cross-sections, FIG. 1(c) planar view, and in FIG. 1(d) perspective view.

These protrusions may include multiple layers, one or more of which may be the top electrode (a TCM). In particular, the protrusion may be covered by the top electrode as in FIGS. 1(a) and 1(b). These protrusions may include multiple layers, one or more of which may be part of the active region, as seen in FIG. 1(a). The active region includes at least one of the absorber(s) and built-in electrostatic and/or effective field forming layers. Layer indices of refraction n must increase or at least remain constant as the impinging light penetrates deeper through protrusion layers. In the case where the active region has an active layer top surface that is at least partially in the protrusion, as seen in FIG. 1(a), the terminal protrusion layer before the active region has an n less than or essentially equal to that of the active region being encountered. In the case where the active layer top surface is not in the protrusion but is planar with the protrusions disposed thereon, as seen in FIG. 1(b), the terminal protrusion layer before the active region has an n larger or essentially equal to that of the active region being encountered.

Figure 1B:
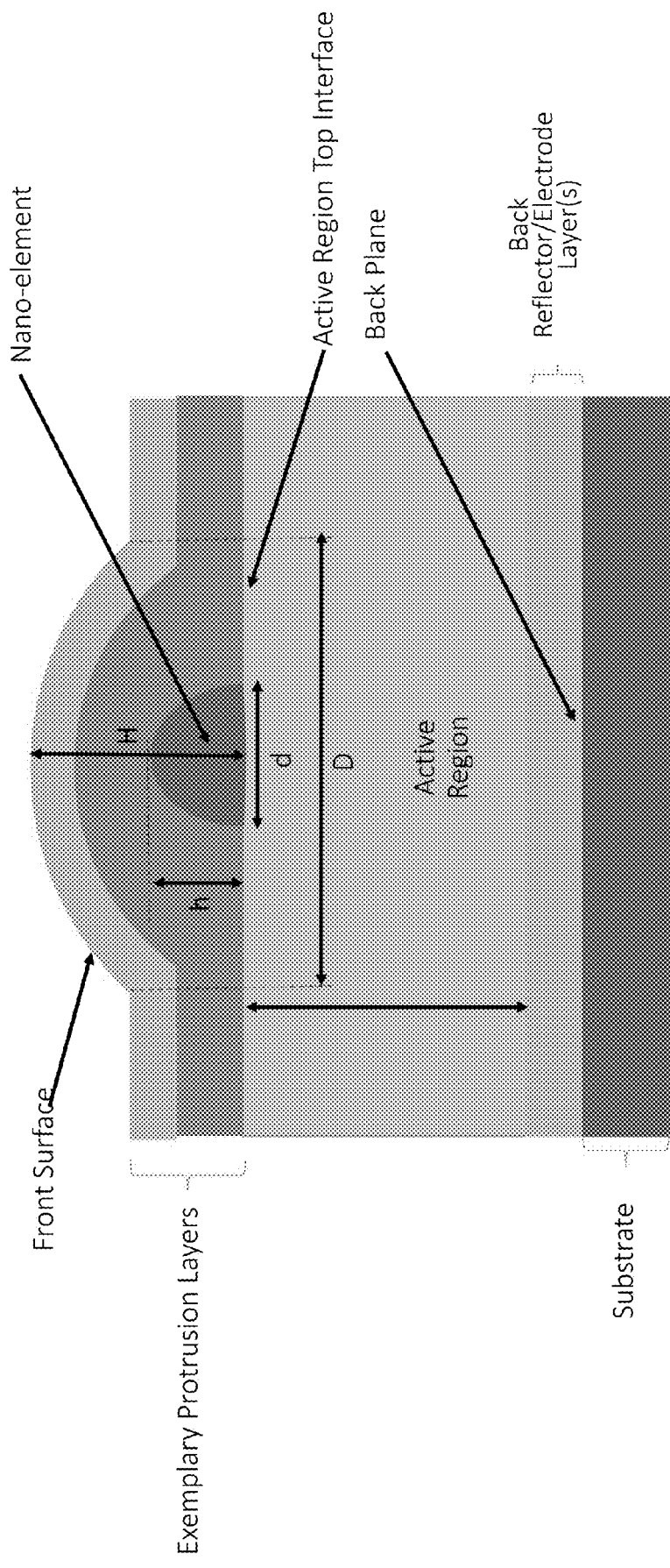
FIG. 1(b) is a schematic cross-sectional view of an inventive embodiment in which nanoelements underlying each one of a periodic array of dome or dome-like protrusions are positioned on top of an active region
Figure 1D:
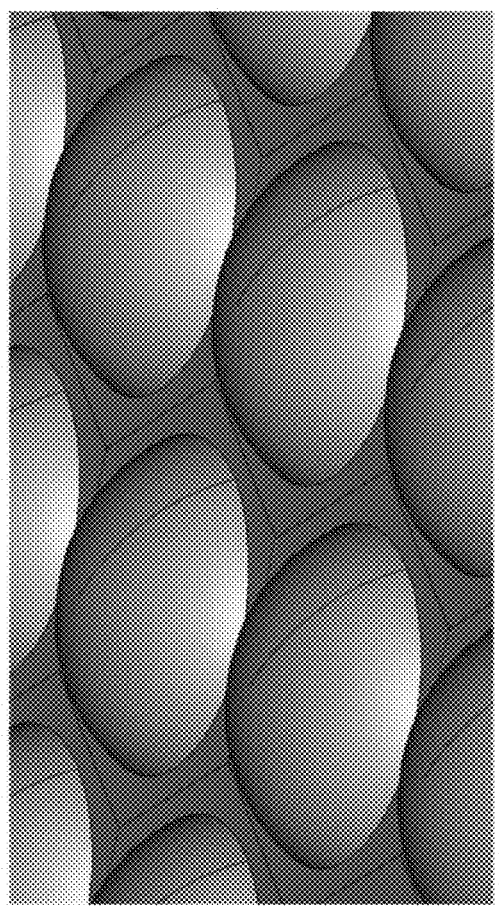
FIG. 1(d) is a perspective view of the top electrode surface of the periodic array of dome or dome-like protrusions either FIG. 1(a) or FIG. 1(b) with no attempt made to depict an optimized flat area among domes.
Figure 2:
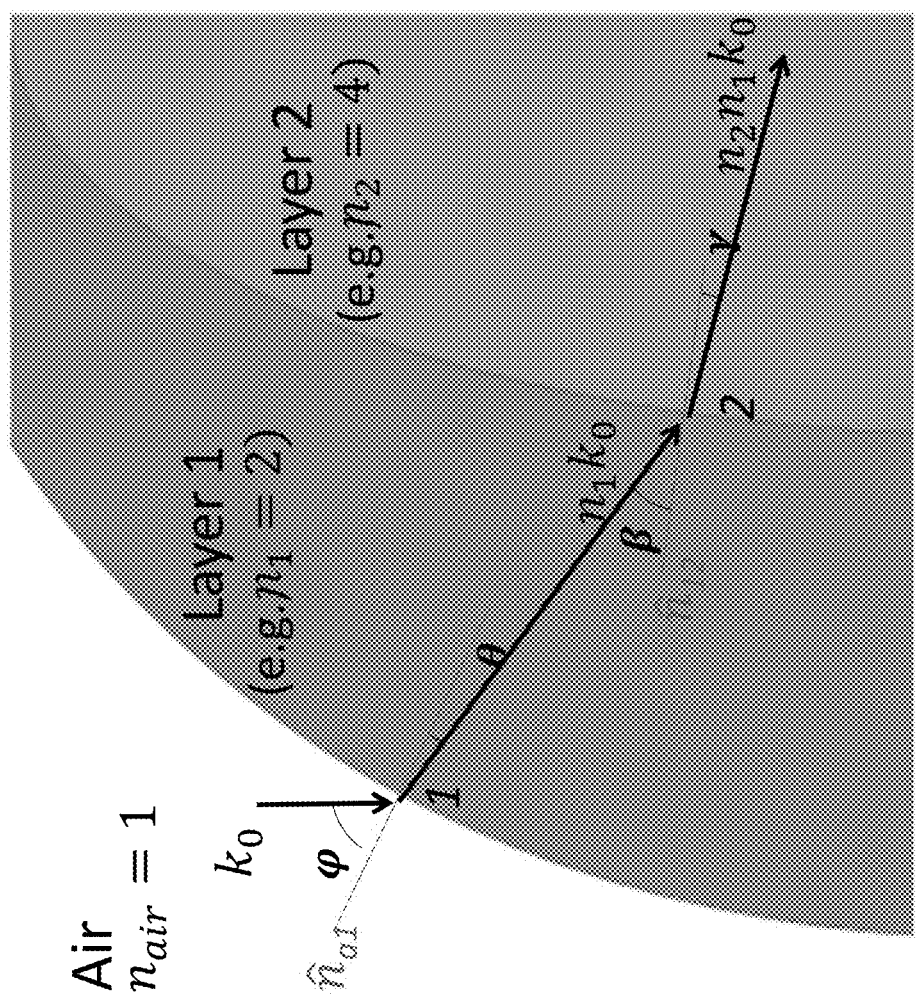
FIG. 2 is a close up of a portion of two successive interfaces in a dome or dome-like protrusion as depicted in the aforementioned drawings; with refraction indices of materials selected to induce an incident photon redirection.

The objective of having protrusion orientation pointing away from the device (FIGS. 1(a) and 1(b)), the protrusion topology, and the varying indices of refraction is to increase or at least maintain the component of the impinging photon momentum parallel to the back plane depicted in FIGS. 1(a) and 1(b); i.e., to increase the parallelity to the back contact of the impinging photon momenta.

Broadly speaking choosing a dome or dome-like protrusion base dimension D, height H, and spacing L shown in FIGS. 1(a)-1(d), as well as the resulting aspect ratio A=H/D affects the efficacy of the momentum change function of these protrusions. Choosing these aspects of the topology as well as the layer by layer n variation and the amount of front surface covered by the protrusion base affects the impact of these characteristics on increasing the component of the impinging photon momentum parallel to the back plane (denoted in FIGS. 1(a)-1(d)). For a given D, the protrusion surface area should be made as large as possible and the amount of the front surface area not covered by protrusions (See FIGS. 1(c) and 1(d) should be made as small as possible subject to processing and economic constraints. For example, using uniform domes or dome-like protrusions of base dimension D which just touch in a hexagonal periodic pattern of spacing L will produce a protrusion covered front surface percentage of 90%. This is not achieved in FIGS. 1(c) and 1(d), for drawing clarity.

To function, the protrusion array—reflector/back electrode structure of the invention disclosed herein requires refracting dome or dome-like structures with the properties described and oriented to protrude away from the R/EBC as seen in FIGS. 1(a)-1(d). The inventive protrusion array—reflector/back electrode (Forms (1)-(3)) architecture of this invention does not necessitate an aspect ratio A such that A ≥2 and therefore the architecture mitigates against the possibility of performance degradation due to sharp features. The important dimensions of the inventive protrusion array—reflector/electrode back contact architecture are the D, H, and L of the dome or dome-like protrusions; they define the topological features shown in FIGS. 1(a)-1(d) including the size of the flat regions among the dome or dome-like structures. While not shown in FIGS. 1(a)-1(d), these flat regions may contain additional, smaller dome or dome-like features also which are positioned randomly or systematically among the protrusions of FIGS. 1(a)-1(d). Additionally, protrusion features and flat region features may (not shown) or may not be textured (random topology).

The nano-elements of dimensions h, d, and L as seen in FIGS. 1(a)-1(d), if present, are seeds utilized mainly to guide protrusion formation during disposition of the dome or dome-like features or layers thereof and may be made using vacuum or non-vacuum deposition steps such as molding, printing, probe printing, etching, and imprinting processing. Their formation does not require glass hard-mask etching. The dome or dome-like protrusion array and the reflector/electrode back contacts function with, or without, the presence of the nano-element seeds of FIGS. 1(a) and 1(b). As noted earlier, the key aspect of the reflector/back electrode invention disclosed herein is the refraction caused by the dome or dome-like features at the front surface. The back reflector/electrode part of this architecture may utilize substrates such as metal foils, glass foils, and organic materials illustratively including polyacetylene, polyphenylene vinylene, polypyrrole, polythiophene, polyaniline polyimide, or polyphenylene sulfide. The back reflector/electrode serves as the counter electrode to the front electrode which itself is the top layer of or is at least a part of the dome-like structures or of the active region.

Figure 3:
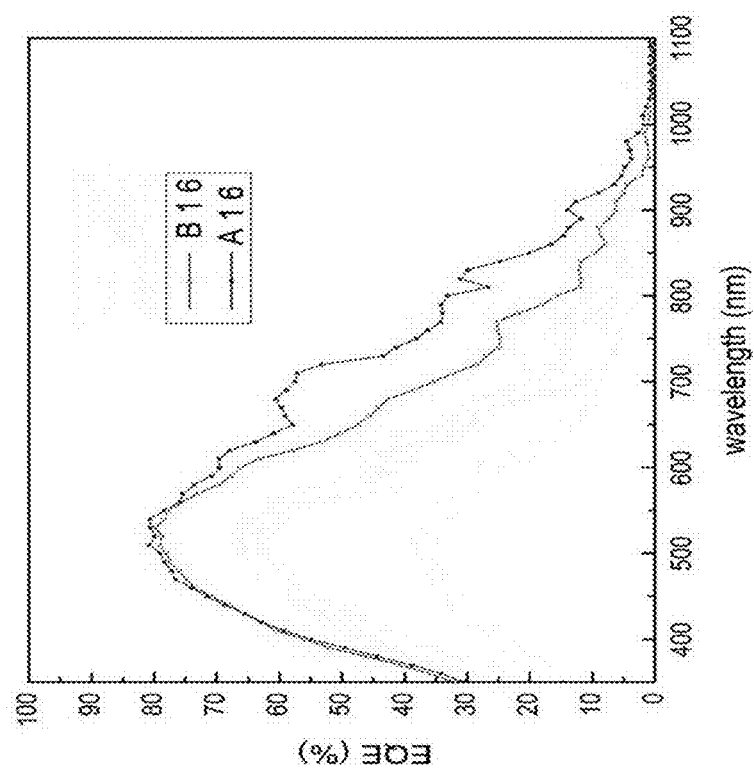
FIG. 3 is a plot of an experimental EQE for two solar cell structures, where both have domes on the front surface with the arrangement seen in FIG. 1(a) but sample A16 has a metal-less AZO reflector/back electrode contact whereas sample B16 has a metal Cr reflector/back electrode contact, where the response of sample A16 is seen to be superior to B16, especially in the "red" wavelengths"

The metal-less reflector/back electrode structure, Form (2) of the three R/EBC forms of the invention disclosed herein, performs very well as seen from Tables I and II and FIG. 3. Form (2) is seen from the description and FIGS. 1(a)-(d) and 2 to differ from the back contacts of Kim et al. in a number of aspects including: (1) The back contacts of Kim et al. are for superstrate devices; (2) the "none BR ZnO:Al [AZO] back contact" of Kim et al.is labeled a non-back reflector structure whereas in the innovative Form (3) structure here a ZnO:Al [AZO] back contact would be specifically designed to function as a metal-less back reflector/electrode contact; (3) the refracting dome or dome-like structures of embodiment of the invention are oriented to protrude away from the device absorber as seen in FIG. 1(a)-(d) whereas the corresponding refracting structures of Kim et al are protruding into the device absorber; (4) embodiments of the inventive metal-less (Form (2)) reflector/back electrode back contacts do not necessitate A ≥2 and therefore mitigate against the possibility of performance degrading sharp features; (5) the important dimensions of the inventive metal-less reflector/electrode back contacts are the D, H, and L of the periodic dome or dome-like features whereas they are the height and base of microcones for Kim et al.; (6) the boundaries of the inventive structure defining the region to be filled with the active region are smooth thereby also helping to avoid the sharp boundary problematic features possible in the back contacts of Kim et al.; (7) the nano-elements seen in FIGS. 1(a) and 1(b) correspond to the microcones of Kim et al., but are made using techniques such as non-vacuum molding, probe printing, or imprinting processing and not glass hard-mask etching; (8) the metal-less reflector/electrode back contacts of this invention do not involve the use of nanoparticles in the R/EBC and therefore do not involve the use of the concomitant nanoparticle application step; and (10), as seen in Table II, the Form (2) metal-less reflector/back electrode contacts of this invention function essentially equally well with, or without, the presence of the nano-elements of FIGS. 1(a) and 1(b). As noted earlier, the key aspect of the protrusion array—reflector/back electrode architecture disclosed here is the refraction caused by the protruding, periodic dome or dome-like features on the front surface and their optimal shape and index of refraction variations with successive layers.

Modeling results used in the study of and design of the protrusion array—Form (2) metal-less reflector/back electrode architecture of this invention are summarized in Table I for the case of a metal-less AZO back reflector/(Form (2)) contact and, for comparison, for several metal back reflector/electrode (Form (1)) contacts using several types of metals. These comparisons are reported for front surface dome cells using solar cell short circuit current Jsc results for nc-Si absorbers of 400 nm thickness. The fact that a protrusion array—metal-less R/EBC (Form (2)) is seen to perform almost as well as a protrusion array—silver (Form (1)) contact is outstanding.

Table II gives results for metal-less AZO back reflector/electrode contacts with nano-elements and without nano-elements. These results underscore the crucial role of the dome or dome-like structures of the front surface in reflector/electrode back contact devices. These results make it apparent that the nano-element principally plays a role in the fabrication process of shaping the dome or dome-like structures, if utilized.

Table I. Jsc values for various protrusion array—metal reflector/electrode back (Form (1)) contact cells and a protrusion array—metal-less R/EBC (Form (2)) cell.

TABLE I

Jsc for Various Metal Reflector/Electrode Back Contact Cells and a Metal-less Cell All with Domes (teff = 434 nm)

| Configuration | Jsc (mA/cm^2) |
|---|---|
| Cr dome solar cell | 22.6 |
| Al dome solar cell | 25.71 |
| Au dome solar cell | 28.54 |
| Metal-less (AZO) dome solar cell | 28.7 |

TABLE II

Protrusion array—Form (2) metal-less AZO reflector/back electrode ncSi cells on polyimide. Cases with and without (w/o) nanoelements and with the absorber thickness adjusted ($t_{eff}$)for absence of the nanoelement are given. Metal-less AZO reflector/back electrode ncSi cells on polyimide (Absorber thickness was 400 nm but was reduced for the case when then nanoelement was not present)

| Configuration | On PI |
|---|---|
| AZO Metal-lesss | 29.53 mA/cm^2 |
| AZO Metal-lessw/o nanoelement | 29.14 mA/cm^2 |
| AZO metal-less w/o nanoelement + teff adjusted | 29.08 mA/cm^2 |

An experimental comparison of the performance of two dome substrate solar cell devices with R/EBC Form (2) metal-less reflector/back electrode back contacts (ZnO:Al back contacts) and with R/EBC Form (1) metal reflector/back electrode back contacts (i.e., Cr back contacts) is presented in FIG. 3. Both have domes on the front surface implemented using the nano-elements of FIG. 1(a) but sample A16 has a metal-less AZO reflector/back electrode contact whereas sample B16 has a Cr reflector/back electrode contact. Chromium was employed here since it has high plasmonic losses in the wavelength region of interest. The red wavelength region response of sample A16 is seen to be superior due to the avoidance of plasmonic losses. These losses are present with the involvement of a metal (B16) as part of the back contact.

As Table III makes clear, protrusion array—Ag R/EBC (Form (1)), protrusion array—metal-less R/EBC (Form (2)), and protrusion array—thick TCM/metal R/EBC (Form (3)) structures perform much better than the corresponding planar (no protrusion array) control cell. As may be further discerned, protrusion array—Ag R/EBC (Form (1)) structures perform only somewhat better than the corresponding protrusion array—metal-less R/EBCs (Form (2)). However, the latter has the distinct advantage of avoiding the use of an expensive metal. Table III makes the extremely interesting point that the protrusion array—thick TCM/Al R/EBC (Form (3)) architecture provides excellent performance. In fact, Table III shows that the short circuit current performance of the protrusion array—thick TCM/Al R/EBC can be better than that of the other two forms of R/EBCs. In other words, this protrusion array—thick TCM/Al R/EBC (Form (3)) architecture can avoid the use of Ag yet give performance equal to, or even somewhat better than, protrusion array—Ag R/EBC (Form (1)) architecture.

All the forms of the protrusion array—R/EBC architecture disclosed herein may be utilized with thin or thick active regions composed of at least one barrier forming and at least one absorber material. Thick active regions may be, for example, what are termed wafers. All the forms of the protrusion array—R/EBCs architecture disclosed herein used one of the three R/EBCs forms listed in Table III. The disclosed architecture, in its various forms, may be employed in cells with a front contact/back contact arrangement; i.e., the + terminal is on one side of the cell and the − terminal is on the other side. The disclosed architecture, in its various forms, may also be employed in cells with a back contact/back contact arrangement; i.e., both the + and − cell terminals are on the back side of the cell.

Figure 4A:
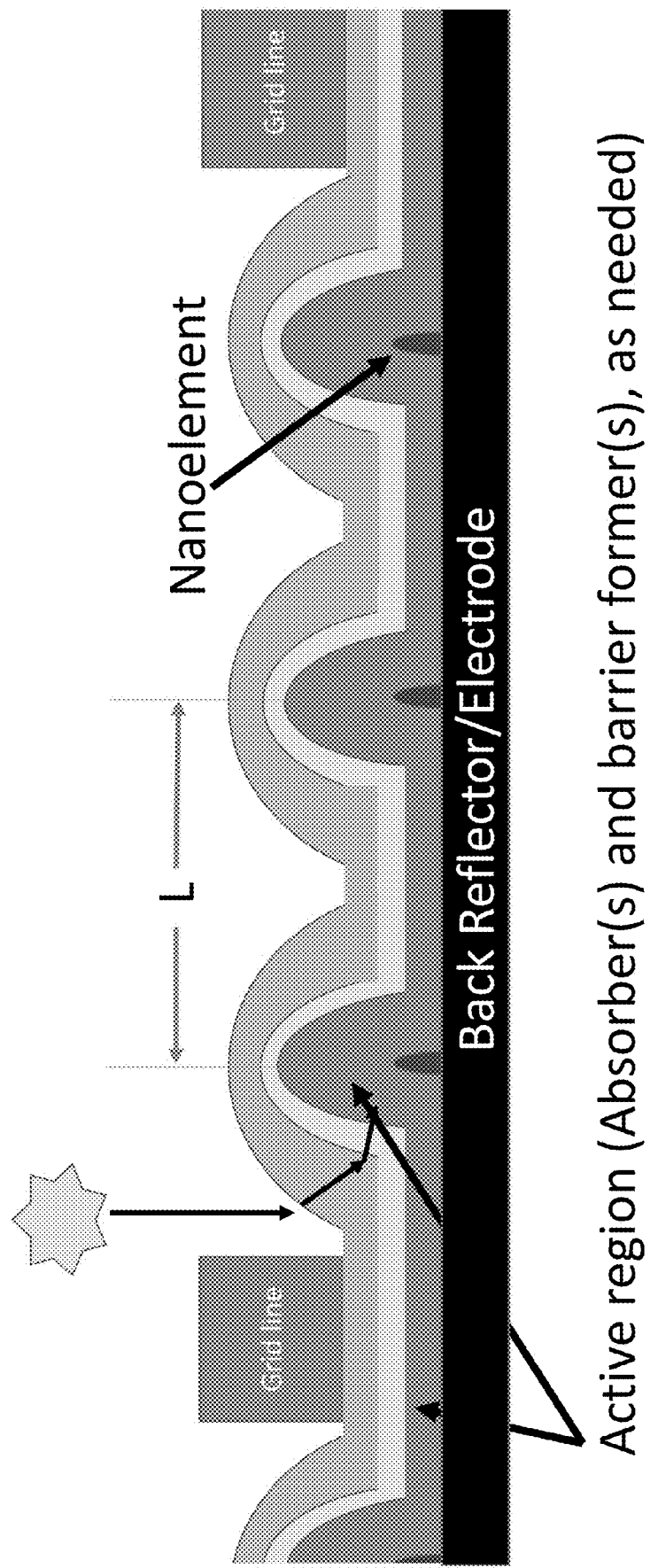
FIGS. 4(a)-(d) are schematics showing various schemes (a)-(d) for positioning of dome or dome-like protrusion arrays between grids in front contact/back contact terminal configurations.
Figure 4B:
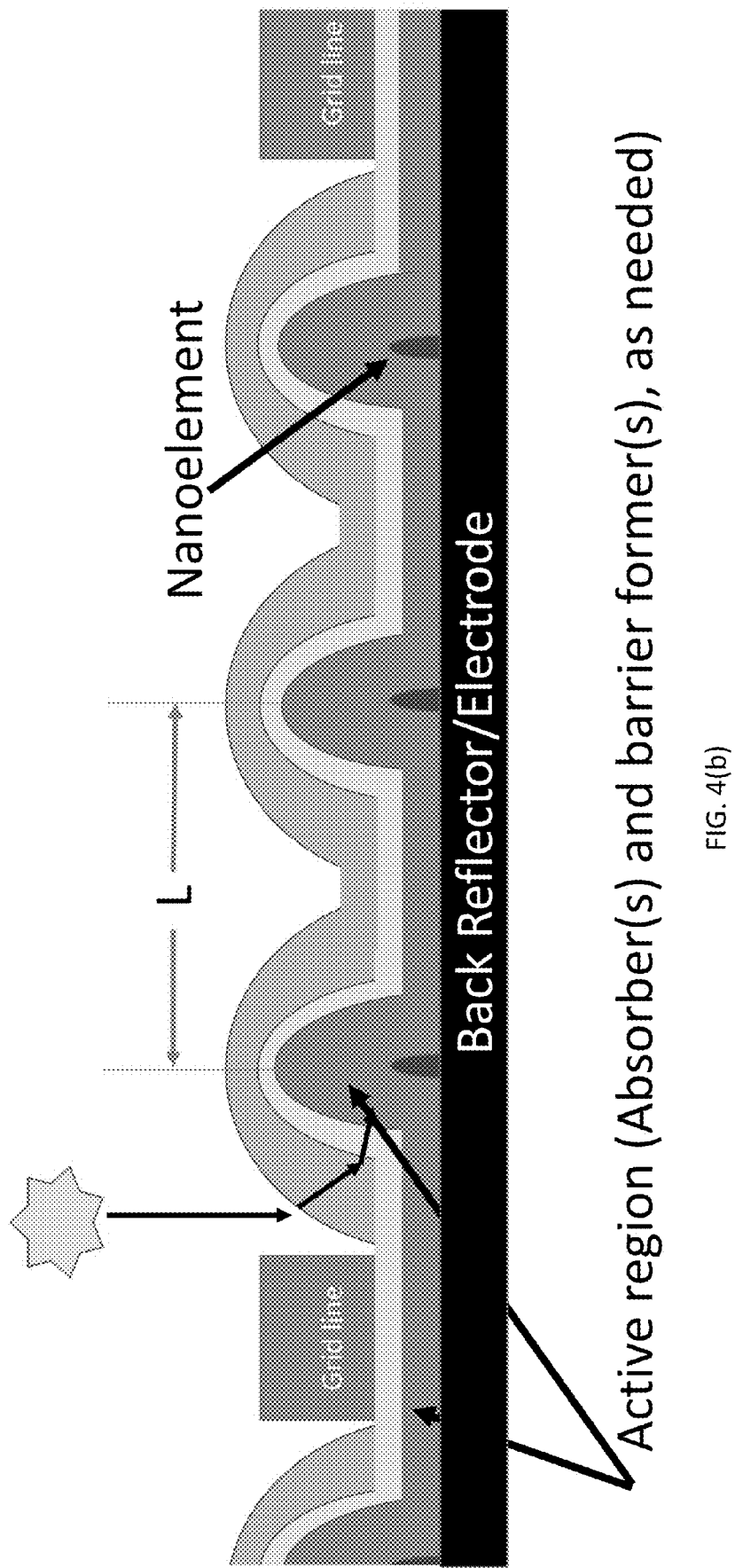

The front contact/back contact arrangement is characterized by a front collection grid (of TCM or metal materials). In this case, the architecture of this invention has protrusion positions located in between these current collecting grid lines, as shown in FIGS. 4(a)-(d). As seen in FIG. 4(a), the grid lines may be disposed, in the thin active region case, after all protrusion layers are present, if these layers are transparent conductive materials (TCMs). This insures front current collection. Alternatively, grid lines may be positioned on any TCM layer of the protrusion which provides electrical continuity to the active region, as shown schematically in FIG. 4(b). In this scheme, the transparent layers in the protrusion above this contacted TCM layer (one is shown in the example of FIG. 4(b)) need not be conducting. One or more may be passivating, encapsulating, or protecting the cell structure.

TABLE III

Architecture comparison

| Cell architecture | Features | Best $J_{SC}$ for this architecture |
|---|---|---|
| Planar top surface control—metal (Form (1)) R/EBCs | Conventional. No protrusion array but same metal R/EBCs as is used in Form (1) | 18.0 mA/cm² for Ag R/EBC |
| (1) Protrusion array—metal (Form (1)) R/EBCs | Metal R/EBCs together with protrusion array. May have an ultra-thin (~0.5-10 nm) optical spacer, and/or contact or selective contact layer over the front of the metal. | 30.7 mA/cm² for protrusion array—Ag R/EBCs |
| (2) Protrusion array—metal-less all TCM (Form (2)) R/EBCs | Nonmetal R/EBCs together with protrusion array, One or more TCM layers involved in providing R/EBCs function which thereby determines TCM thickness. May have a metal at the backmost region with no significant optical function but serving as a contact and/or grid and/or mechanical support. May have an ultra-thin (~0.5-10 nm) optical spacer, and/or contact or selective contact layer over the front of the TCM region. | 29.5 mA/cm² for protrusion array—AZO R/EBCs |
| (3) Protrusion array—thick TCM/metal (Form (3)) R/EBCs | Both TCM + Al (for cost saving) are involved in R/EBCs function and has protrusion array. May have an ultra-thin (~0.5-10 nm) optical spacer, and/or contact or selective contact layer over the front of TCM region. | 30.8 mA/cm² for protrusion array—AZO/Al R/EBCs |

The nanoelements which may be used to control the protrusion locations in these schemes are positioned between the grid areas. This is done by approaches such as probe-type, molding, printing, or imprinting-type nanoelement positioning.

Figure 4C:
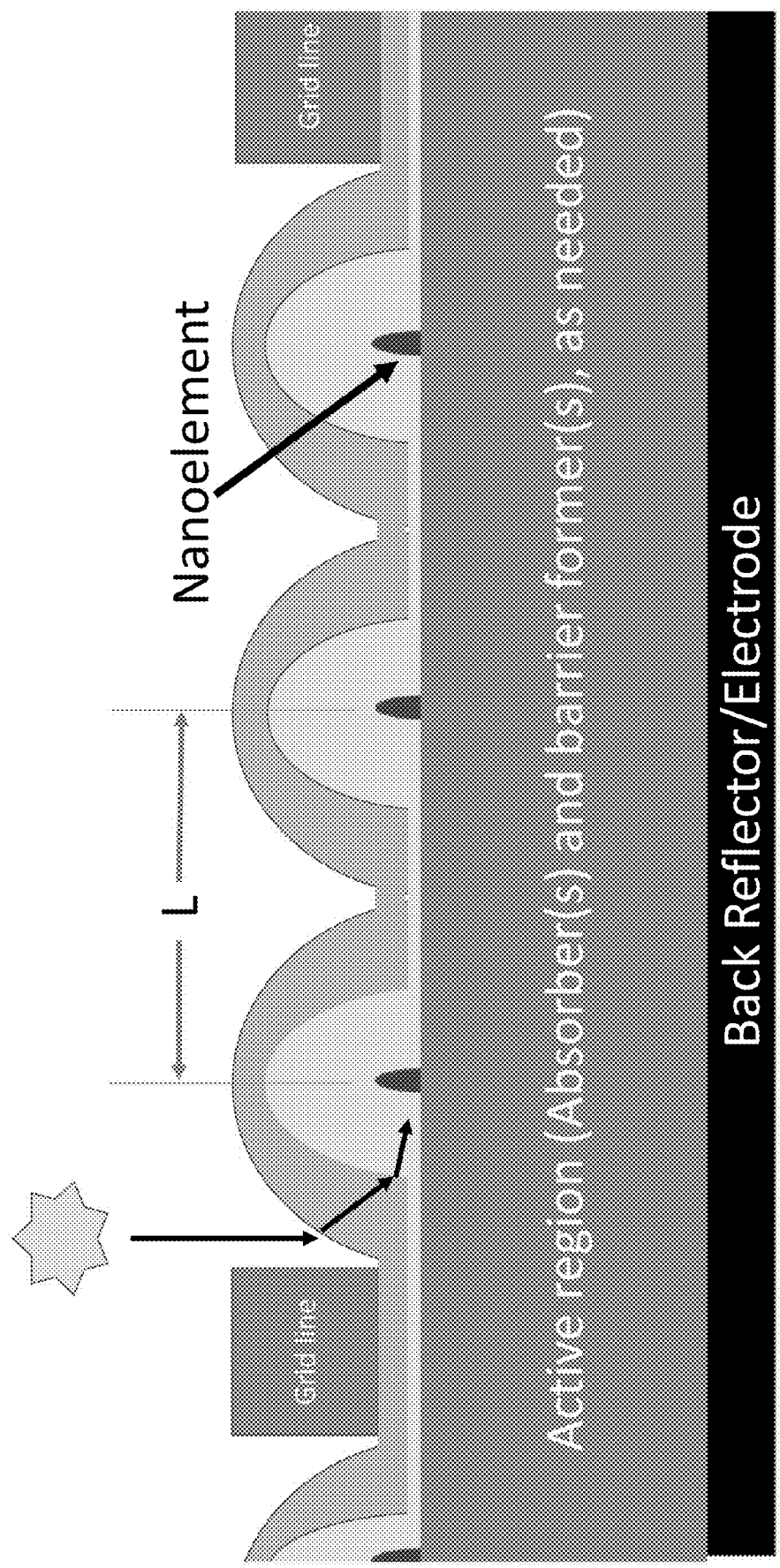
Figure 4D:
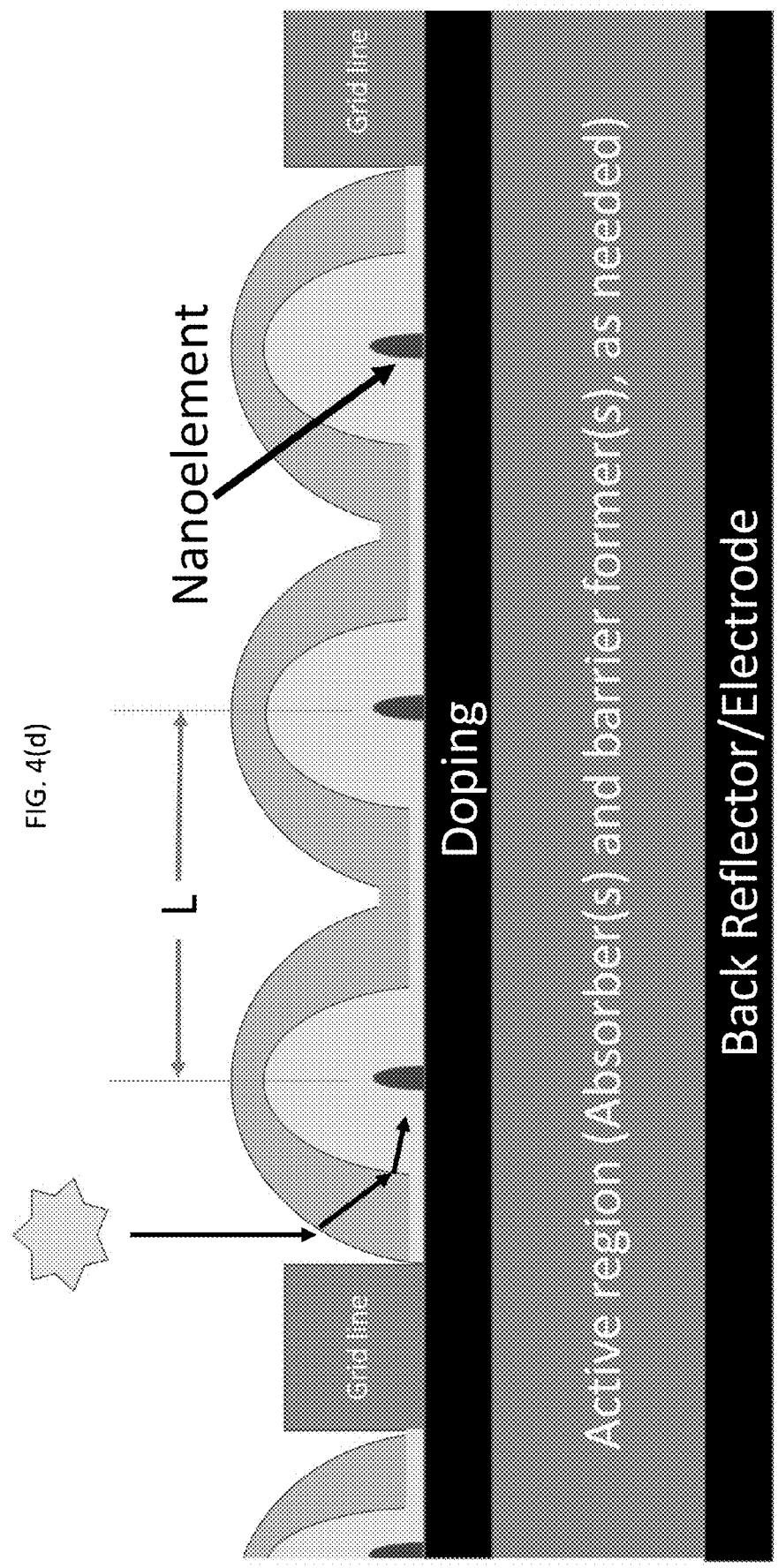

As seen in FIG. 4(c), grid lines may be positioned in a planar surface active region case after all protrusion layers are present, if these layers are transparent conductive materials. The grid lines also may be positioned on any TCM protrusion layer which provides electrical continuity to the active region. This latter case corresponds to FIG. 4(b) and its discussion. Another approach is to etch all the disposed protrusion films off thereby defining grid areas and subsequently forming the grids through steps involving standard lithography/deposition/etching processing. The etching would be done down to a doping layer as seen in FIG. 4(d). The analogous processing can be done for the case in which the absorber region is in the protrusion with the corresponding doping layer incorporated into the active region.

Figure 5A:
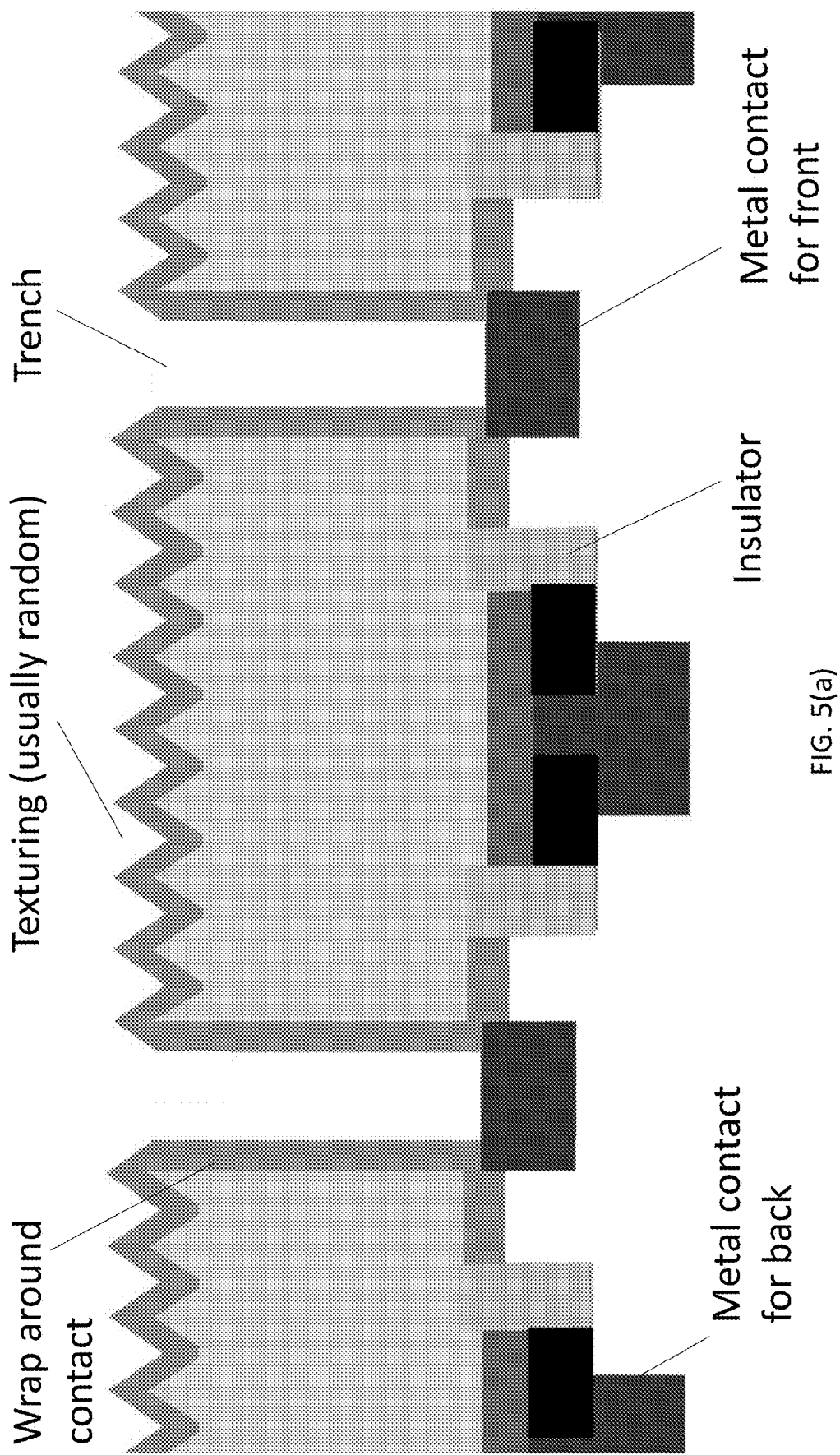
FIGS. 5(a) and 5(b) illustrate (a) State-of-the-art example of a back contact/back contact arrangement in which texturing (usually random) has been utilized at the front, and (b) back contact/back contact arrangement in which the texturing has been replaced with a protrusion array where any of the three forms of the R/EBCs listed in Table III may be employed with the protrusion array.
Figure 5B:
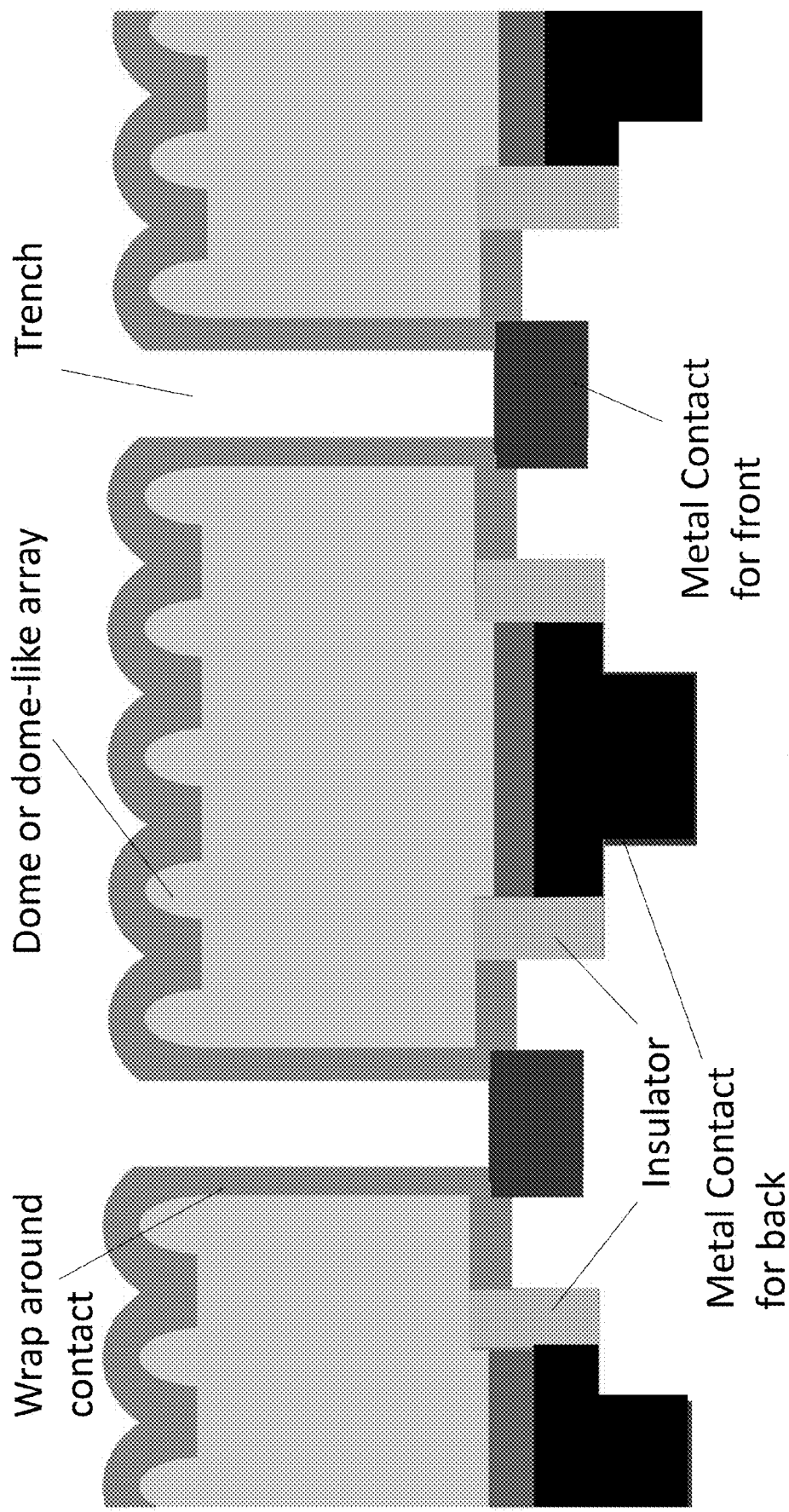

In the case of a back contact/back contact arrangement, both the + and − cell contacts are on the back side of the cell. This results in two sets of contacts at the back. FIG. 5(a) gives a state-of-the-art example, for comparison, of a back contact/back contact arrangement in which texturing has been utilized at the front. As seen from FIG. 5(a), some method must be used to bring the front electrode current and voltage to the cell back. In the examples of FIGS. 5(a) and 5(b), this is accomplished by a so-called "wrap-around" approach using trenching with the trench containing the required current carrier material. FIG. 5(b) shows the type of back contact/back contact arrangement in which the texturing of FIG. 5(a) is replaced with the protrusion array disclosed herein. Any of the three forms of the R/EBCs listed in Table III may be employed with the protrusion array in back contact/back contact arrangements. Whichever R/EBC is utilized, it obviously must be located at the back in FIG. 5(b) to not short circuit to the contact coming from the cell front.

Since L is the spacing between the protrusions (and essentially the same as D), as well as being the spacing between, if used, the nanoelements seeding the protrusions in their hexagonal lattice, the spacing in between trench edges in FIG. 5(b) should be roughly equal to or somewhat larger than mL where m is an integer number. However, this protrusion array spacing constraint may not be strictly followed if not doing so advantageously reduces cost and increases simplicity.

Returning to the structure of the back reflector/electrodes, it is noted that the periodic protrusion array—R/EBC architecture of this invention in its Form (2) and Form (3) versions of Table III can require optimization of the TCM series resistance versus the optical effectiveness for these types of architecture. This can be done using a variety of thicknesses and of TCMs including topological 2-D materials such as graphene. The TCM layer thickness in the R/EBC of a Form (2) R/EBC cell may lie in the range of about 0.2 to 400 nm or thicker depending on the resistivity and transmissivity of the TCM used. The TCM layer thickness in the R/EBC of a Form (3) R/EBC cell may lie in the range of about 0.2 to 400 nm or thicker as dictated by the resistivity and transmissivity of the TCM.

Figure 6A:
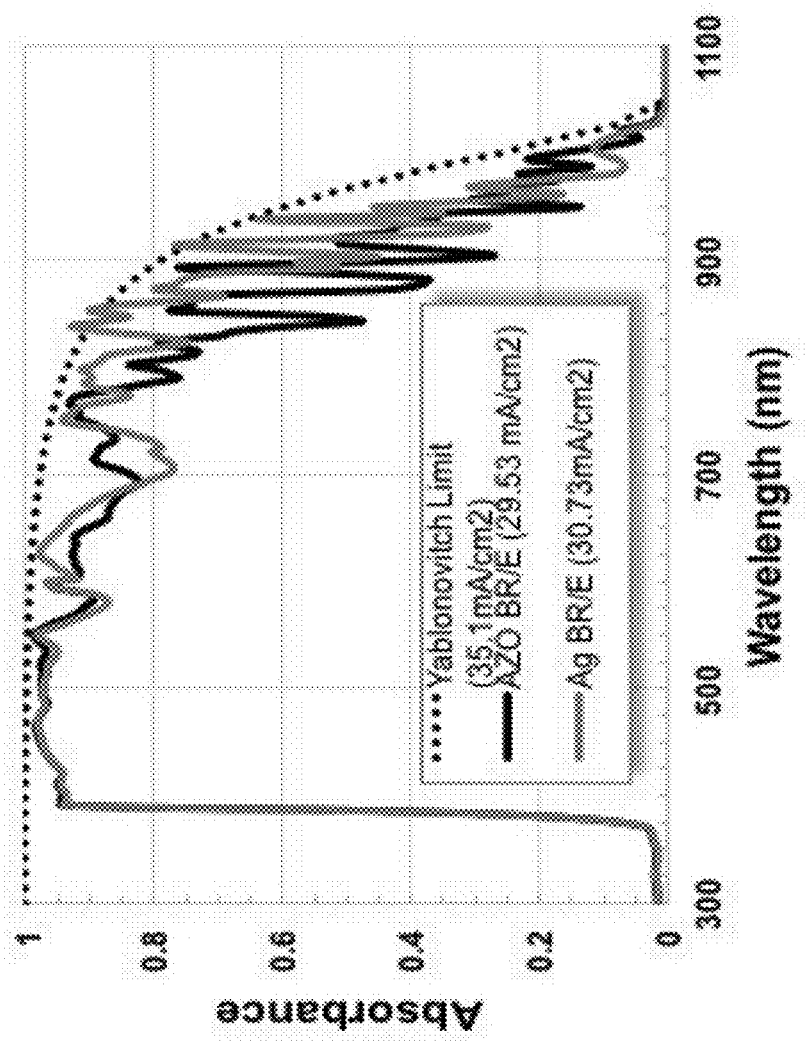
FIGS. 6(a) and 6(b) illustrate (a) The computed A(λ) plot for a protrusion array—Form (2) R/EBC using AZO as the transparent conducting material (TCM), and (b) The computed A (2) plot for a protrusion array—Form (3) thick TCM/metal BR/E cell of the structure AZO/Al, where in both (a) and (b), the resulting $J_{SC}$ values are given in the insets, and also in both (a) and (b) the computed A(λ) plot for a protrusion array—Form (1) Ag BR/E cell as well as the theoretical Yablonovich limit (YL)

The experimental (FIG. 3) and modeling (FIG. 6(a)) results for protrusion array cells with Form (2) R/EBCs demonstrate that excellent performance can be obtained from the protrusion array-metal-less all TCM R/EBC (Form (2)) cell architecture. In the experimental and modelling results presented, AZO is the TCM employed in a metal-less R/EBC device. Other TCMs including 2-D materials such as graphene may be utilized. The results given in FIG. 6(a) and listed in Table III show specifically that protrusion array metal-less AZO R/EBCs can achieve, counterintuitively, $J_{SC}$ performances which are almost as good as protrusion array-Ag R/EBC Form (1) cells. As noted earlier, this obviously offers the avoidance of the use of Ag or any other metal film with an optical function within the R/EBC of cells, when advantageous.

Figure 6B:
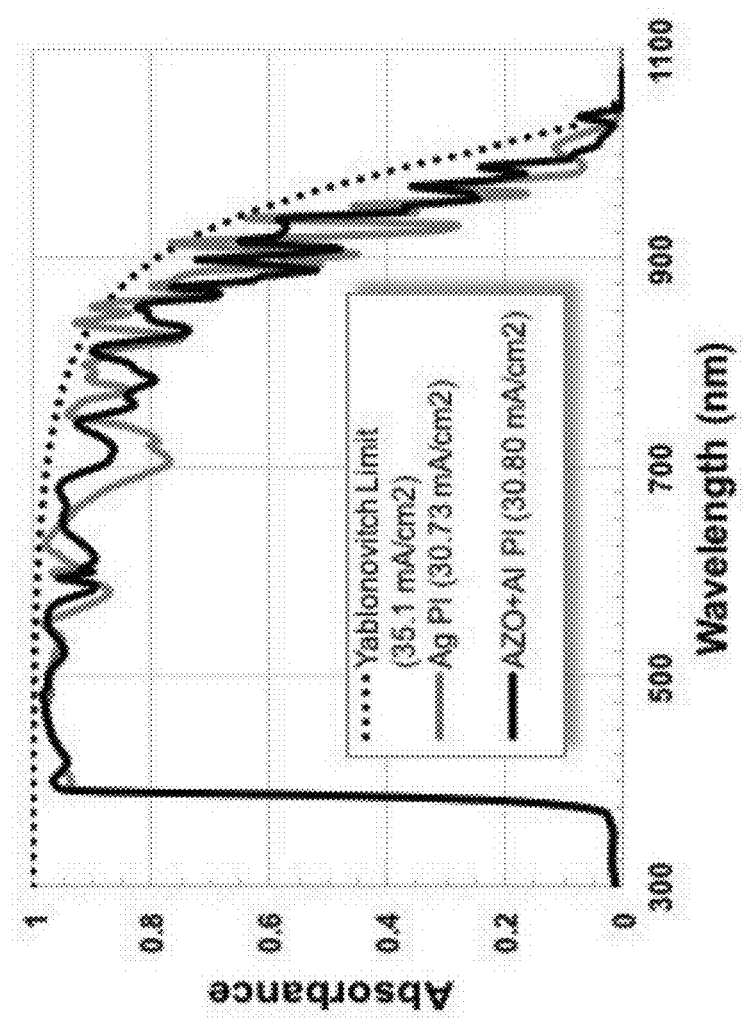

The performance of protrusion array—Form (1) R/EBC cells is superior to that of their corresponding planar (no protrusion array) cells. For the situation when the metal is Ag in the Form (1) cell, the $J_{SC}$ is increased by 70% over the $J_{SC}$ of the corresponding planar cell. However, it is very important to stress that the Form (3) periodic protrusion array—thick TCM/metal BR/E cells can give behavior (See FIG. 6(b)) that is superior to that of protrusion array—Ag Form (1) R/EBC cells. Surprisingly, this can occur even when using Al, with its inherently larger plasmonic losses compared to Ag, as the metal in the thick TCM/metal Form (3) R/EBC cell of FIG. 6(b). This outstanding performance may be seen in the plots and $J_{SC}$ tabulations in FIG. 6(b).

In specific inventive embodiments the positioning of light intensity concentrations is used to control photogeneration and photocarrier collection locations. In these specific embodiments the dome or dome-like protrusions, which may or may not be centered on nanoelements, control the positioning of light intensity concentrations and thereby control the location of photogeneration and photocarrier collection in a solar cell or light detector device. Embodiments of the inventive designs enable enhanced light collection and carrier (electron, hole, exciton) management (LCCM). The LCCM designs offer the ability to control where impinging light concentrates in a structure thereby giving the opportunity to dictate where photogeneration and collection occur. For solar cells, this provides for an improved utilization of the solar spectrum (e.g., AM1.5) and for improved detectors that are more fully able to exploit pertinent regions of the electromagnetic spectrum. By controlling where impinging light concentrates within a structure, absorptance A (A(λ) times 100 gives the percentage of the spectrum utilized for photogeneration at the wavelength λ) may be increased thereby enhancing short circuit current density, open circuit voltage, and device efficiency.

Figure 1C:
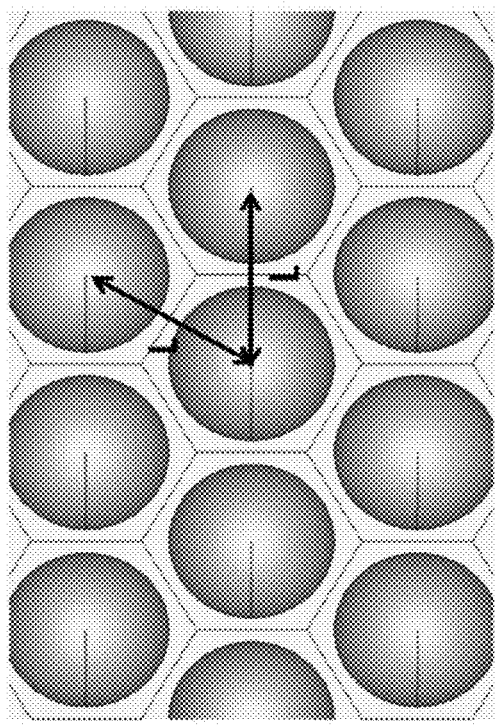
FIG. 1(c) is a planar view of the top electrode surface of the periodic hexagonal array with characteristic dimension L of dome or dome-like protrusions of either of the aforementioned drawings with no attempt made to depict an optimized flat area among domes.

In specific inventive embodiments the positioning of light intensity concentrations is accomplished in the dome or dome-like protrusions as previously described above. In an exemplary embodiment an array of the domes may be arranged in the hexagonal array as shown in FIG. 1(c) with a characteristic spacing L. Each dome or dome-like protrusion has an electrode layer inside of which is an active region and each protrusion is positioned on a planar active region. These two active regions contain, in total, at least one absorber material and at least one junction (space charge) former in the top electrode/active region interface, in the counter electrode/active region interface, or in the active bulk. The electrode interfaces of the active regions may have selective Ohmic contacts allowing for the passing of only one type of carrier (S. J. Fonash, Solar Cell Device Physics, 2nd edition, Academic Press, 2010), or Ohmic contact former materials. The dome or dome-like protrusions may each be centered on a nanoelement positioned on a back layer. The nanoelement may exist in the planar active material only or the nanoelement may extend into the dome or dome-like active material. Each nanoelement may be part of the counter electrode.

When present, this nanoelement may extend into the planar-like active material only or it may extend further and be in the dome or dome-like active material. Light intensity impinging on dome or dome-like protrusions in solar cell use tends to principally manifest itself as Fabry-Perot-like waves set-up in the structure's active regions for wavelengths below about 800-880 nm, depending on the design. As wavelengths get larger, this Fabry-Perot-like pattern in these LCCM structures tends to break-up producing localized (resonance) regions of light intensity concentration, and therefore producing localized regions of photogeneration intensity concentration. These concentration regions can appear even in the horizontal regions of the structure. The result for many wavelengths is increased absorptance A in the active regions (The quantity A(λ) times 100 gives the percentage of the spectrum at λ available for producing photocarriers) and therefore increased photogenerated carrier availability. This leads to enhanced short circuit current density, open circuit voltage, and device performance. For AM1.5 sunlight plots, A(λ) is even found to exceed, for certain designs and wavelengths, its Yablonovich theoretical limit (S. J. Fonash, Introduction to Light Trapping in Solar Cell and Photo-detector Devices, Academic Press, 2015)

Light intensity impinging on dome or dome-like protrusions in solar cell use tends to principally manifest itself as Fabry-Perot-like waves set-up in the structure's active regions for wavelengths larger than those absorbed at the top surface of the dome active region. For larger wavelengths, this Fabry-Perot-like pattern tends to transition into localized mode regions in which light intensity is spatially concentrated. These same light concentration regions are therefore where photogeneration intensity is concentrated. These concentration regions can appear even in the horizontal, off center line regions of the structure. The result is increased active region absorptance (A(λ)) for many wavelengths λ. For sunlight, absorptance (A) is found to approach, reach, or exceed, for certain wavelengths, the Yablonovich theoretical limit (S. J. Fonash, Introduction to Light Trapping in Solar Cell and Photo-detector Devices, Academic Press, 2015).

The opportunity presented by the advent of localized light intensity and photogenerated carrier (electrons, holes, excitons) concentration patterns in the active regions of the designs of this invention allows for simultaneous light and carrier collection enhancement when nanoelements are present. That is, in addition to contributing to controlling the positioning of the light and therefore of photogeneration, nanoelements can play a counter electrode role thereby enhancing photocarrier collection. This role may include being part of a junction, a selective contact, or an Ohmic contact. When the nanoelements employ semiconductor or other materials sensitive to the environment, these materials are protected from the environment by their location from the outer surface. Adjusting device dimensions and materials as well as the introduction of nanoelements affects the wavelength range for which the transition into having localized modes occurs. Nanoelements, including their extent into the active regions and their shape (e.g., rounded-top cylinder shapes, cone-like forms) offer significant design flexibility. Having the ability to position and control the strength of photocarrier generation concentration regions in a device is a very unique feature of this invention. Having the ability to enhance carrier collection in a device using nanoelements is another unique feature of this invention. Using the nanoelements to actually create the dome or dome-like structures during deposition is a third unique feature of this invention. The presence of nanoelements may modify the light intensity pattern so as to reduce back electrode plasmonic losses, which is a very unique, fourth feature of this invention.

When present, nanoelements further control and position localized light intensity and therefore photogenerated carrier (electrons, holes, excitons) concentration patterns in the active regions. Nanoelements also offer the opportunity for carrier collection enhancement by playing a counter electrode role. This may include being part of a junction, a selective Ohmic contact, or an Ohmic contact. When the nanoelements employ semiconductor or other sensitive organic or inorganic materials, these materials are protected from the environment by their location from the outer surface. Adjusting device dimensions and materials affects the wavelength range for which the transition into having localized modes occurs as do the addition of nanoelements, their extent (in to the active regions), and shape (e.g., rounded-top cylinder shapes, cones).

The nanoelements used in embodiments of the invention may have a composition that includes at least one of a conductor (e.g., transport conducting material, TCO, Ag, Al, graphene), a semiconductor (e.g., perovskite, Si), or an insulator. When used, in addition to their role in positioning and shaping the localized concentration regions and therefore photocarrier generation regions, nanoelements may be utilized to decompose photogenerated excitons as well as to collect photogenerated electrons or holes. Nanoelements can be utilized to reduce the collection length for a carrier. Embodiments of the invention allow for concentration regions to be advantageously positioned with respect to the nanoelement creating them. For example, a carrier with poorer transport properties can be photogenerated closer to a nanoelectrode by tailoring the light intensity patterning resulting in enhanced successful collection.

Figure 7:
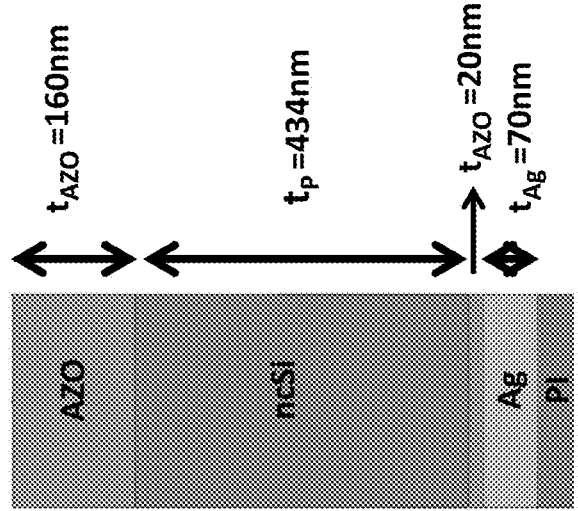
FIG. 7 is a cross sectional view showing the layers in a conventional prior art planar solar cell or detector device.
Figure 8:
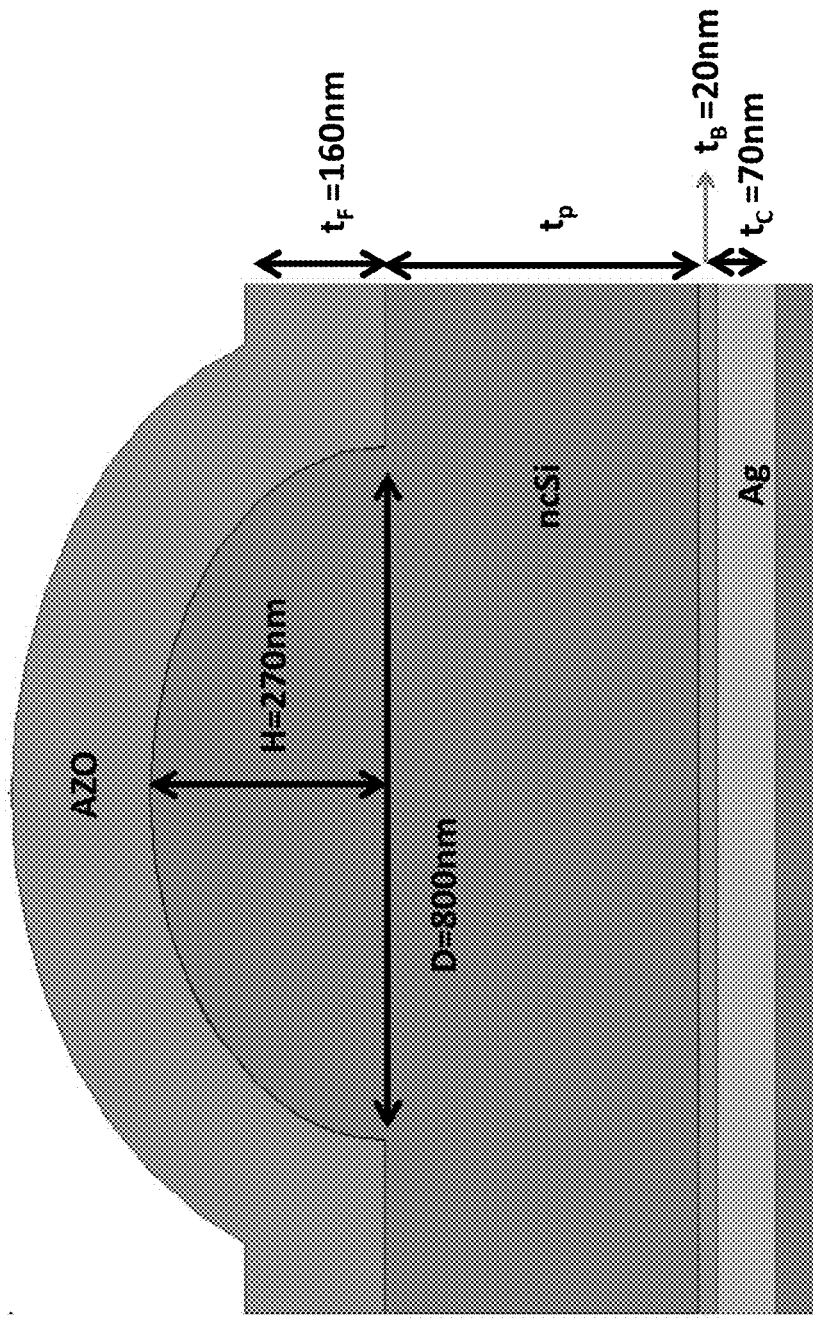
FIG. 8 is a cross sectional view of an inventive embodiment of a light collection and carrier (electron, hole, exciton) management (LCCM solar cell or detector device) with its definitive feature of domes or dome-like protrusions at the incoming light side, where the protrustion active region sit on a planar-like active region.
Figures 12A, 12B:
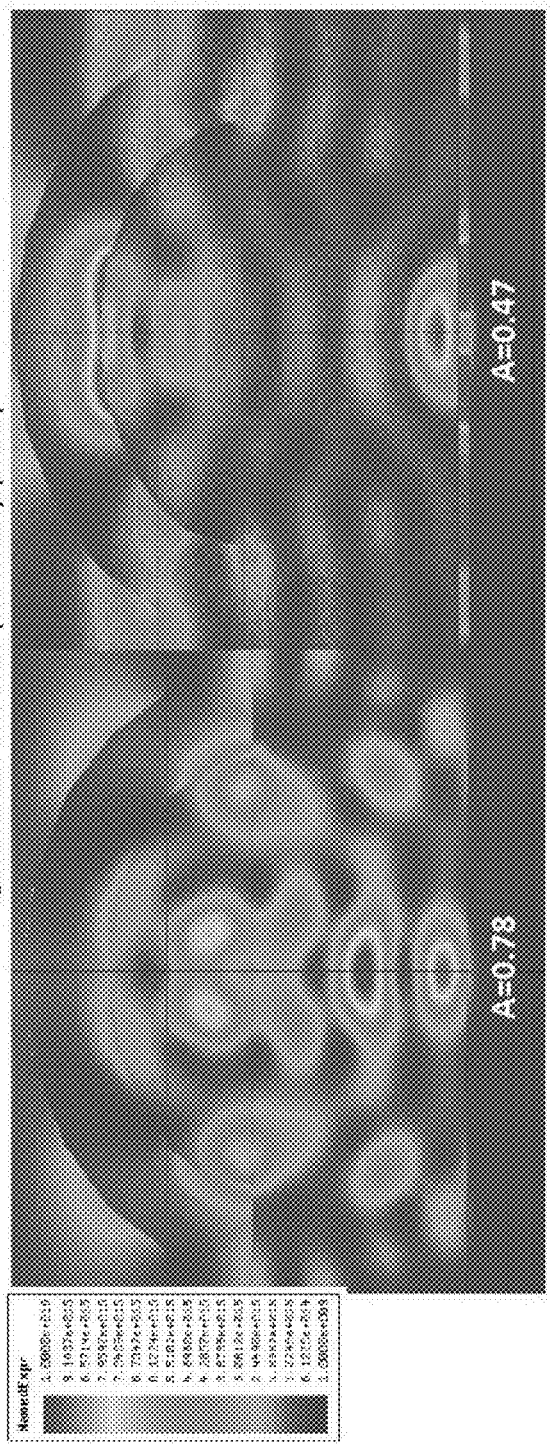
FIGS. 12(a) and 12(b) illustrate intensity distributions resulting in and around the structure of FIG. 8 without a nanoelement due to the normal impingement of sunlight (e.g., AM1.5) with a wavelength of 882 nm using a high-frequency structure simulator (HFSS) code for (a) planar active region without a buffer and nanoelement and a thickness of 400 nm, and (b) planar active region with a buffer and no nanoelement and a thickness of 400 nm.
Figures 13A, 13B:
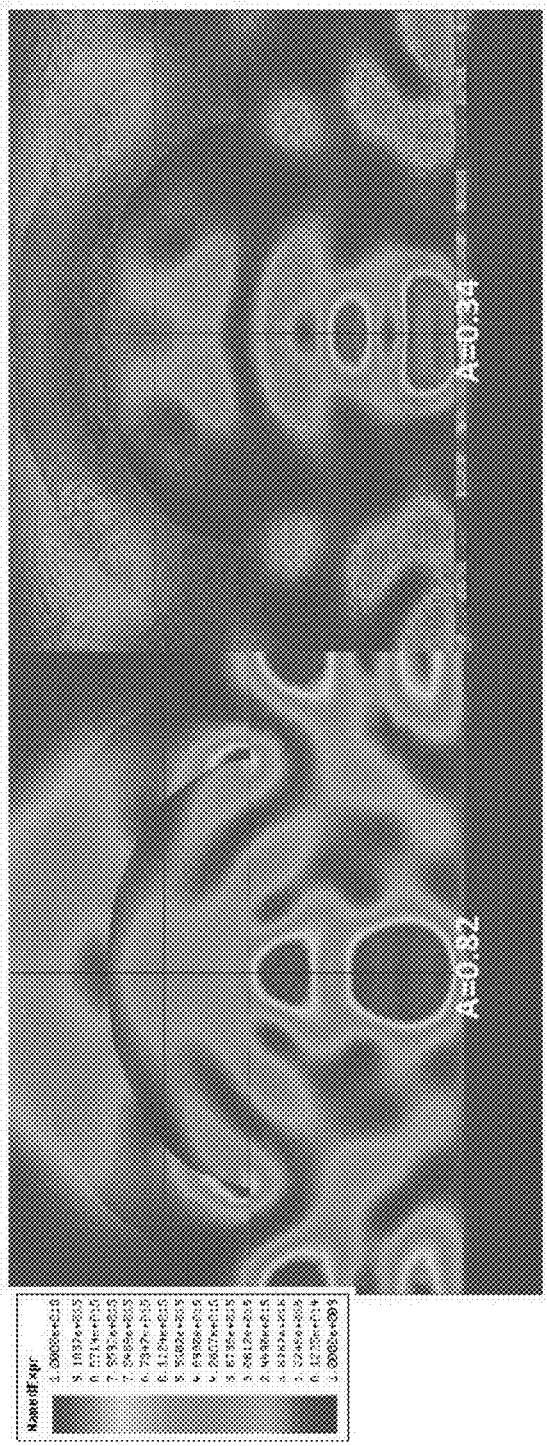
FIGS. 13(a) and 13(b) illustrate intensity distributions resulting in and around the structure of FIG. 8 without a nanoelement due to the normal impingement of sunlight (e.g., AM1.5) with a wavelength of 920 nm using a high-frequency structure simulator (HFSS) code for (a) planar active region without a buffer and nanoelement and a thickness of 400 nm, and (b) planar active region with a buffer and no nanoelement and a thickness of 400 nm.

Shown in FIG. 7 is a conventional prior art planar (flat) solar cell or detector device. FIG. 8 shows an inventive embodiment with of a LCCM solar cell or detector device with its definitive feature of domes or dome-like protrusions at the incoming light side and arranged in a hexagonal array with spacing L (FIG. 1a). The LCCM device of FIG. 8 has a dome protrusion and planar region with nc-Si absorber active regions, AZO front layer, and a reflector/electrode back contact (R/EBC). The R/EBC has a AZO buffer (spacer), and Ag back conductor without a nanoelement. It is noted that in order to insure valid comparisons among designs, the thickness of the planar active regions must be adjusted to insure the amount of absorber material is constant in all designs. The top layer and the back conductor thicknesses are kept the same in all designs for consistency. The buffer layer is varied with design.

The array of dome or dome-like features can be produced by depositing materials into a mold. Such a mold can be used in a role-2-role process. Each dome or dome-like feature contains an active region under the top electrode and is situated on a planar active region of thickness tp. Active regions (in total, the active region) are composed of absorber materials and may contain junction forming materials, selective contact materials, and Ohmic contact materials. Structural features such as height H', diameter D', and spacing L of domes in an array may be adjusted for the application. The front layer thickness $t_F$, buffer layer thickness $t_B$, and back metal thickness $t_C$ shown in FIG. 8 are selected for a given application.

In specific embodiments of the invention physical optics modelling (using the commercially available HFFS modelling code) was applied to the dome or dome-like array on planar region structures for exemplary demonstrations of the impact of structural features and design. Physical (wave) optics is well known to be the correct formulation of light (electromagnetic wave) impingement on and interaction with structural features. The approximation of geometrical (ray tracing) optics becomes of less relevance the more the light wavelengths of interest are of the order of or smaller than the structural feature sizes ((S. J. Fonash, Introduction to Light Trapping in Solar Cell and Photo-detector Devices, Academic Press, 2015).

FIGS. 9-13 have been generated by employing physical optics to analyze the detailed effects of sunlight impinging on a solar cell having an array (FIG. 1(c)) of dome structures (FIG. 8). The impinging solar spectrum can be expressed as power (intensity in W/area/band width) or in the more germane form of photons (photons/area/S/band width) at a given wavelength. The intensity distribution resulting in and around the structure due to the normal impingement of sunlight (e.g., AM1.5) onto FIG. 8 is what is shown in FIGS. 9-13 using a high-frequency structure simulator (HFSS) code. HFSS is a commercial finite element method solver for electromagnetic structures from Ansys. Inc. The data generated shows where the photons from this incoming sunlight reside in and around the structure as a function of position in the structure and wavelength of the spectrum. From this information the absorptance A (sunlight absorbed in the active region/sunlight impinging on the active region for a given wavelength) given in FIGS. 9-13 has been calculated from the intensity plots for the various wavelengths shown for t_P=400 nm and t_P=362 nm. The same front layer and back metal layer thicknesses as well as dome height, diameter, and spacing are used for both the planar active region thicknesses whereas two buffer layer thicknesses (t_B=20 nm or 0 nm) are used in FIGS. 9-13. The other dimensions employed for these figures are specifically (AZO) t_F=160 nm, (Ag) t_C=70 nm, H'=270 nm, D'=800, and L=1200 nm. In these examples, the front layer on which light impinges was simply chosen to be the transparent conducting material aluminum zinc oxide (AZO). The buffer layers were also chosen to be AZO, whereas the conductor at the back has been chosen to be Ag. The choice of Ag (which has high plasmonic loss) was made to show that the detrimental impact of plasmonic loss can be reduced in various LCCM designs. In all cases the active region is nc-Si which may be doped to form junctions.

The resulting intensity plots for AM1.5 impinging on the array are seen in FIGS. 9-13. As may be noted, a number of features are present that are much different from what would be expected from geometrical optics and yet are crucial to optimal solar cell design. Geometrical optics would be expected to show refraction at the air/top layer and top layer/active region interfaces acting to focus the incoming energy generally toward the center of the device. Physical optics provides much more information. In the lower wavelengths of this impinging spectrum (e.g., lambda=711 nm and 765 nm) Fabry-Perot type waves are seen to be set-up in the device. For longer wavelengths, physical optics shows the incoming light becomes more concentrated in specific sections (FIGS. 10 and 11). For the shorter planar active region device (FIG. 11a) this even occurs in the planar active region. Absence of a buffer layer is seen to contribute to nano-scale concentration as seen in FIGS. 12 and 13 for this device. Strong intensity patterns in the active regions are very important because these are regions where there is strong photocarrier (i.e., excitons, free electrons, free holes) generation by light absorption.

In situations where the impinging sunlight can more easily reach the back metal layer of FIG. 8, high intensity (red) power density regions are seen to be present in that material. These regions in a metal are symptomatic of light power loss and not of photogeneration since, in a metal, the light power is dissipated by creating a plasmonic loss response rather than by creating photocarriers (S. J. Fonash, Solar Cell Device Physics, 2nd edition, Academic Press, 2010).

FIGS. 9(a) and (b) illustrate two light intensity patterns for lambda=711 nm. The intensity distribution set-up for the wavelength 711 nm for two nanoelement-less LCCM devices (9(a), 9(b)) each having a buffer. The devices are distinguished by a thinner planar-like active region for. 9(a). Red indicates the highest light and for the active region only, the highest photocarrier intensity concentration; dark blue is the lowest. Both lengths show Fabry-Perot waves. The result of their differences is in a larger absorptance for FIG. 9(a) even though it is seen to have some plasmonic back layer loss.

FIGS. 10(a) and 10(b) give the light intensity patterns for lambda=765 nm. The intensity distribution set-up for the wavelength 765 nm for two nanoelement-less LCCM devices each having a buffer is shown. The devices are distinguished by 10(a) having a thinner planar-like active region. Red is the highest light and, for the active regions, the highest photocarrier intensity concentration; dark blue is the lowest. Again Fabry-Perot waves are seen for both planar active region lengths and an example of wasted light intensity can be seen located outside of the active regions. Both planar active region lengths show the formation of intense localized (resonance) modes positioned about the centerline of the structure. FIG. 10(b) also shows plasmonic loss in the Ag back layer at the centerline region.

FIGS. 11(a) and 11(b) illustrate the intensity distribution set-up for the wavelength 872 nm for two nanoelement-less LCCM devices each having a buffer. The devices are distinguished by 11(a) having a thinner planar-like active region. Red is the highest light and therefore, in the active region, the highest photocarrier intensity concentration; dark blue is the lowest. FIG. 11(a) shows impinging light has been gathered into very strong localized modes of light intensity about the centerline and light concentration is even seen in the edge regions in the shorter device while FIG. 11(b) still has some vestige of Fabry-Perot waves. The result of these differences is in a larger absorptance (A) for FIG. 11(a) even though it is seen to have some pronounced plasmonic Ag layer loss. In summary, importantly and unexpectedly FIG. 9-11 show localized nano-scale light intensity modes can be set up inside a device thereby affecting light absorption capabilities; i.e., the presence of these localized modes means device design can specifically control where photocarriers are created, if plasmonic loss occurs, where carriers are collected, or all three. The work also clearly indicates that structure dimensions can affect performance. As shown by figure pairs FIGS. 12(a), 12(b) and 13(a), 13(b), the materials used can also affect the light distribution taking place inside FIG. 8. Specifically, FIGS. 12a and 13a have no buffer layer while FIGS. 12b and 13b have the 20 nm buffer layer utilized for FIGS. 9-11. Both FIGS. 12 and 13 have $t_p$=400 nm and the impinging light wavelength is lambda=882 nm for FIG. 12 and lambda=920 nm for FIG. 13. As is seen in these distributions of the incoming sunlight intensity pattern set up within a device, materials as well as dimensions affect the intensity distributions.

Figure 14:
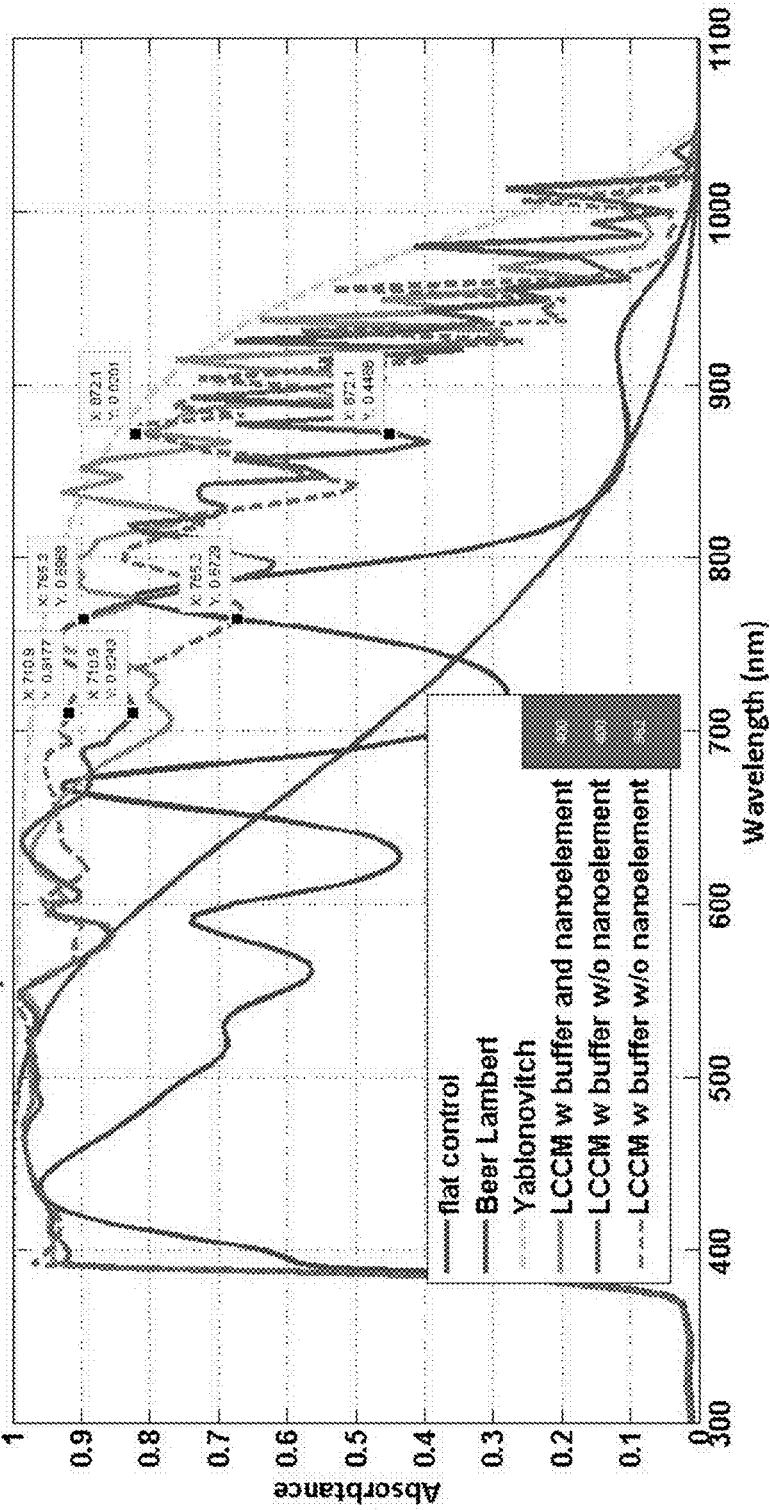
FIG. 14 is a graph with two plots of Absorbtance versus wavelength that have been determined from extensive HFSS optical modelling of sunlight (e.g., AM1.5) impinging on the structure shown in FIG. 8 for the two planar active region thicknesses of FIGS. 9-13.

FIG. 14 is a graph with two plots of absorptance (A) versus wavelength that have been determined from extensive HFSS optical modelling of sunlight (e.g., AM1.5) impinging on the structure shown in FIG. 8 for the two planar active region thicknesses used in FIGS. 12 and 13. The absorptance values on these nanoelement-less curves include the A values noted on FIGS. 12 and 13 for specific wavelengths. The three absorptance versus wavelength plots for the planar, control cell of FIG. 7 produced (1) by physical optics, (2) by the simple Beer-Lambert model (S. J. Fonash, Introduction to Light Trapping in Solar Cell and Photodetector Devices, Academic Press, 2015), and (3) by the Yablonovitch model are also given in FIG. 14. As shown in FIG. 14, absorptance across the solar spectrum wavelength range of interest for a nanoelement-less nc-Si cell with a planar-like 400 nm active region (solid curve) and a nanoelement-less nc-Si cell with a planar-like 362 nm active region (dashed curve) is excellent compared to the planar cell. A cell with a coated PI nanoelement and a planar-like 400 nm active region is also shown to introduce the impact of the presence of a nanoelement. Results from models for absorptance (as a function of λ) for the control prior art flat cell of FIG. 7 are shown for comparison. As can be noted from FIG. 14, the presence of just simply the dome structures greatly enhances the absorptance values for wavelengths larger than about 550 nm. This is quite significant for solar cells since the peak in the photon distribution in AM1.5 occurs in the 500 to 875 nm wavelength range (S. J. Fonash, Solar Cell Device Physics, $2^{nd}$ edition, Academic Press, 2010). The curves for the two nanoelement-less dome structure cases in FIG. 14 show that the actual absorptance value at a given wavelength can be adjusted by the planar active layer thickness.

Figure 15:
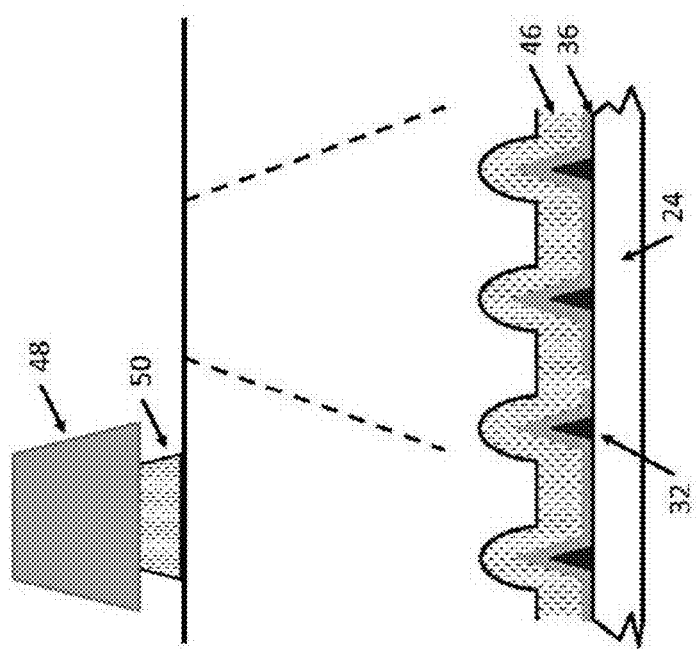
FIG. 15 illustrates an array of nanoelements onto which materials for the buffer or buffer/conductor layer and active regions have been deposited.

As noted, the impact of having the dome or dome-like structures centered on a nanoelement is also shown in FIG. 14 for one case. The presence of this nanoelement is seen to have a dramatic effect on the wavelength dependence of absorptance including giving rise to wavelength regions for which the Yablonovitch limit is equaled or exceeded. The centering of the planar and dome or dome-like active regions with respect to a nanoelement can be attained by deposition of the materials of these features onto a nanoelement. The nanoelements may be created in position by imprinting as disclosed in U.S. Pat. No. 8,294,025 and as seen in the example of FIG. 15. Shown in FIG. 15 is the array of nanoelements (32) onto which materials for the buffer or buffer/conductor (36) layer and active regions (46) have been deposited. These materials are all supported by substrate 24 which may be organic or inorganic. The deposition stream (50) coming from the deposition mechanism (48) is seen operating in an exemplary roll-2-role mode.

Figure 16:
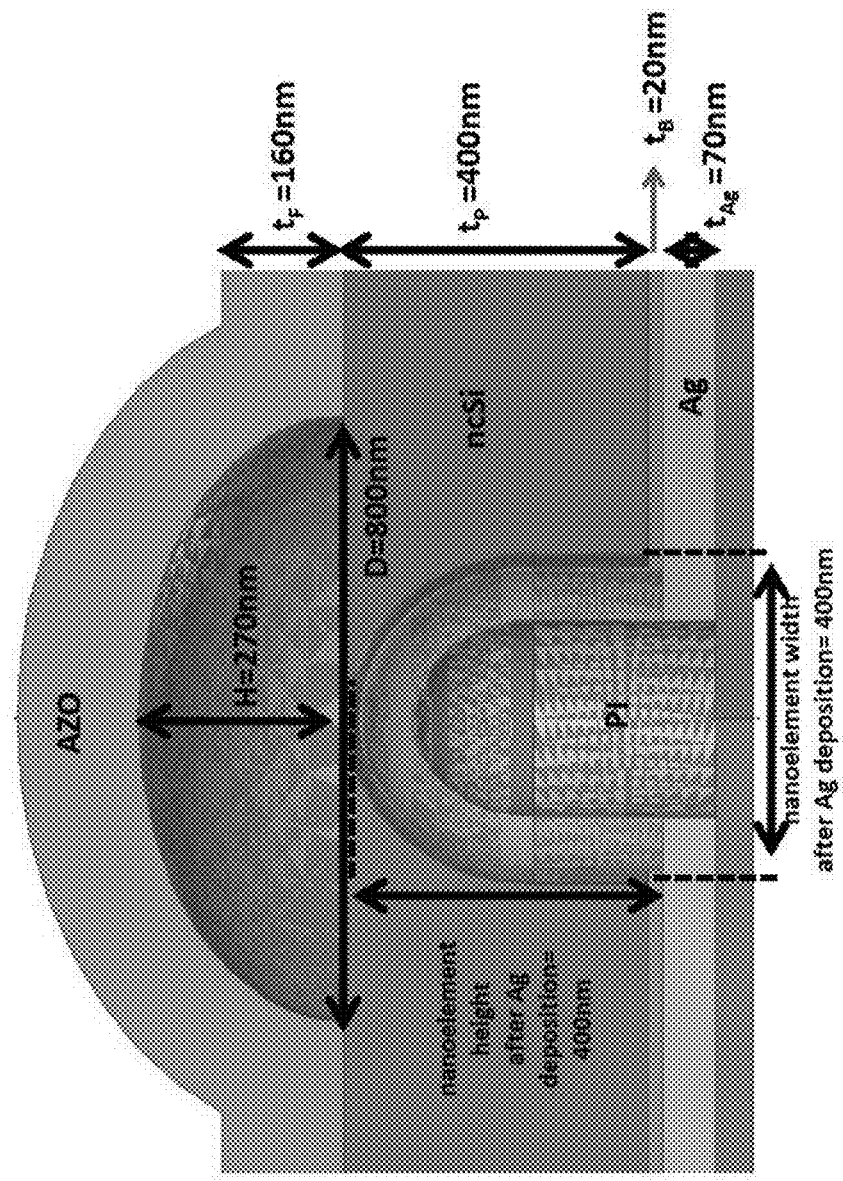
FIG. 16 illustrates a cross section of an inventive embodiment of a LCCM with centering of each dome or dome-like structure on a nanoelement.

FIG. 16 illustrates an inventive embodiment of centering each dome or dome-like protrusion on a nanoelement. Comparisons of the light intensity (and therefore, in the active regions, photocarrier generation concentration) plots (a) for with a nanoelement and (b) for without a nanoelement are presented in FIGS. 17 (lambda=802 nm), 18 (lambda=852 nm), and 19 (lambda=914 nm).

FIGS. 17(a) and 17(b) illustrate a comparison of the light concentrations present in LCCM devices having R/EBCs with a back buffer while having (17(a)) and not having an Ag coated PI nanoelement. These data are for at a wavelength of 802 nm. Red is the highest light and therefore, in the active region, photocarrier intensity concentration; dark blue is the lowest.

Figures 18A, 18B:
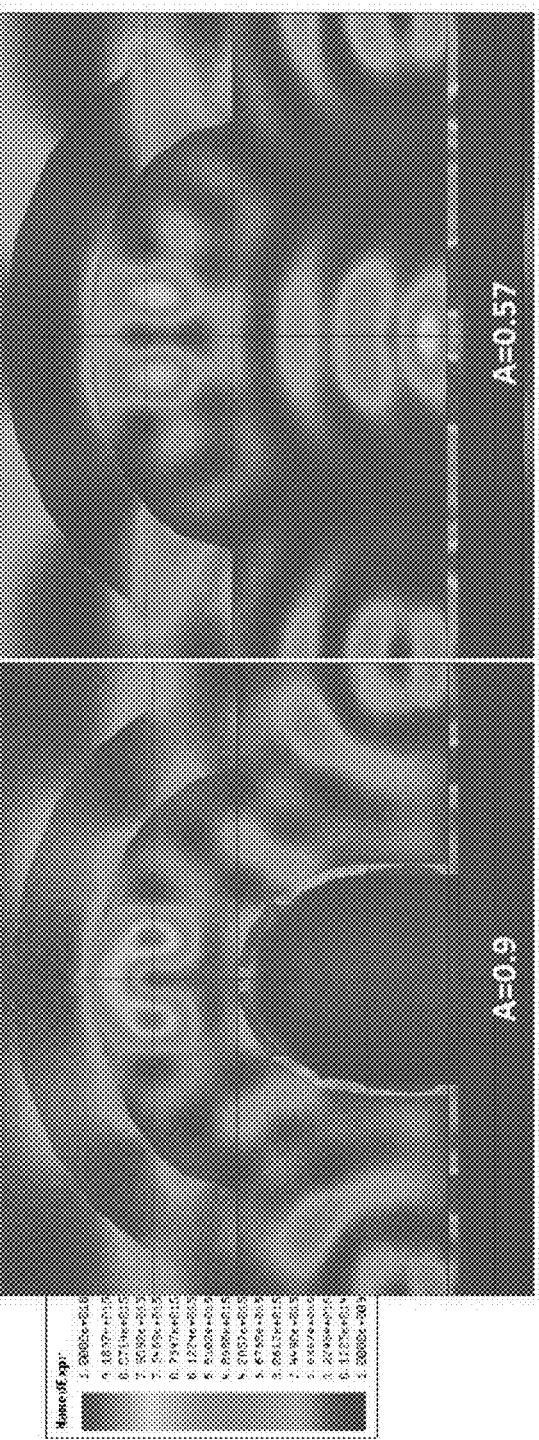
FIGS. 18(a) and 18(b) illustrate intensity distributions resulting in and around the structure of FIG. 8 with a back buffer with and without a nanoelement due to the normal impingement of sunlight (e.g., AM1.5) with a wavelength of 852.3 nm using a high-frequency structure simulator (HFSS) code for (a) LCCM with a buffer and nanoelement and a thickness of 400 nm, and (b) LCCM with a buffer and no nanoelement and a thickness of 400 nm.

FIGS. 18(a) and 18(b) illustrate a comparison of the light concentrations present in LCCM devices with a back buffer and with (18(a)) and without (18(b)) an Ag coated PI nanoelement at a wavelength of 852.3 nm. Red is the highest light and therefore, in the active region, photocarrier intensity concentration; dark blue is the lowest.

Figures 19A, 19B:
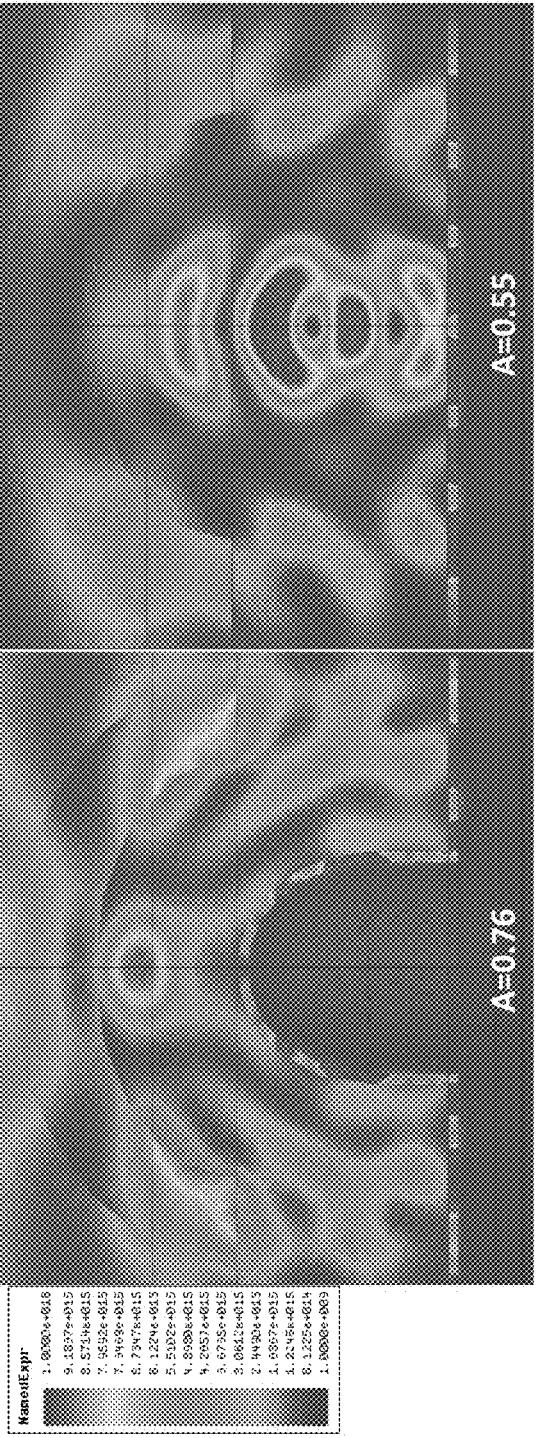
FIGS. 19(a) and 19(b) illustrate intensity distributions resulting in and around the structure of FIG. 8 with a back buffer with and without a nanoelement due to the normal impingement of sunlight (e.g., AM1.5) with a wavelength of 914.6 nm using a high-frequency structure simulator (HFSS) code for (a) LCCM with a buffer and nanoelement and a thickness of 400 nm, and (b) LCCM with a buffer and no nanoelement and a thickness of 400 nm.

FIGS. 19(a) and 19(b) illustrate a comparison of the light concentrations present in LCCM devices with a back buffer and with (19(a)) and without (19(b)) an Ag coated PI nanoelement at a wavelength of 902 nm. Red is the highest light and therefore photocarrier intensity concentration (in active regions); dark blue is the lowest.

The FIGS. 17-19 show that the nano-scale intensity patterns and therefore the generation patterns in the active region can be dramatically changed at a given wavelength by the presence of a nanoelement. The breaking up of the Fabry-Perot waves and strong scattering into the edge regions by the presence of the centered, Ag coated polyimide (PI) nanoelement are obvious in the (a) versions of the figures. As can be noted from the absorptance (A) values calculated for these figures, the insertion of a nanoelement can be very advantageous for light management. It can also be very advantageous for photocarrier collection management, since the nanoelement can be part of the back contact as in the structure used in FIGS. 17-19. The nanoelement can be an Ohmic contact, a junction, or selective contact causing photocarrier (electron, hole, or exciton) separation and collection.

Figures 20A, 20B:
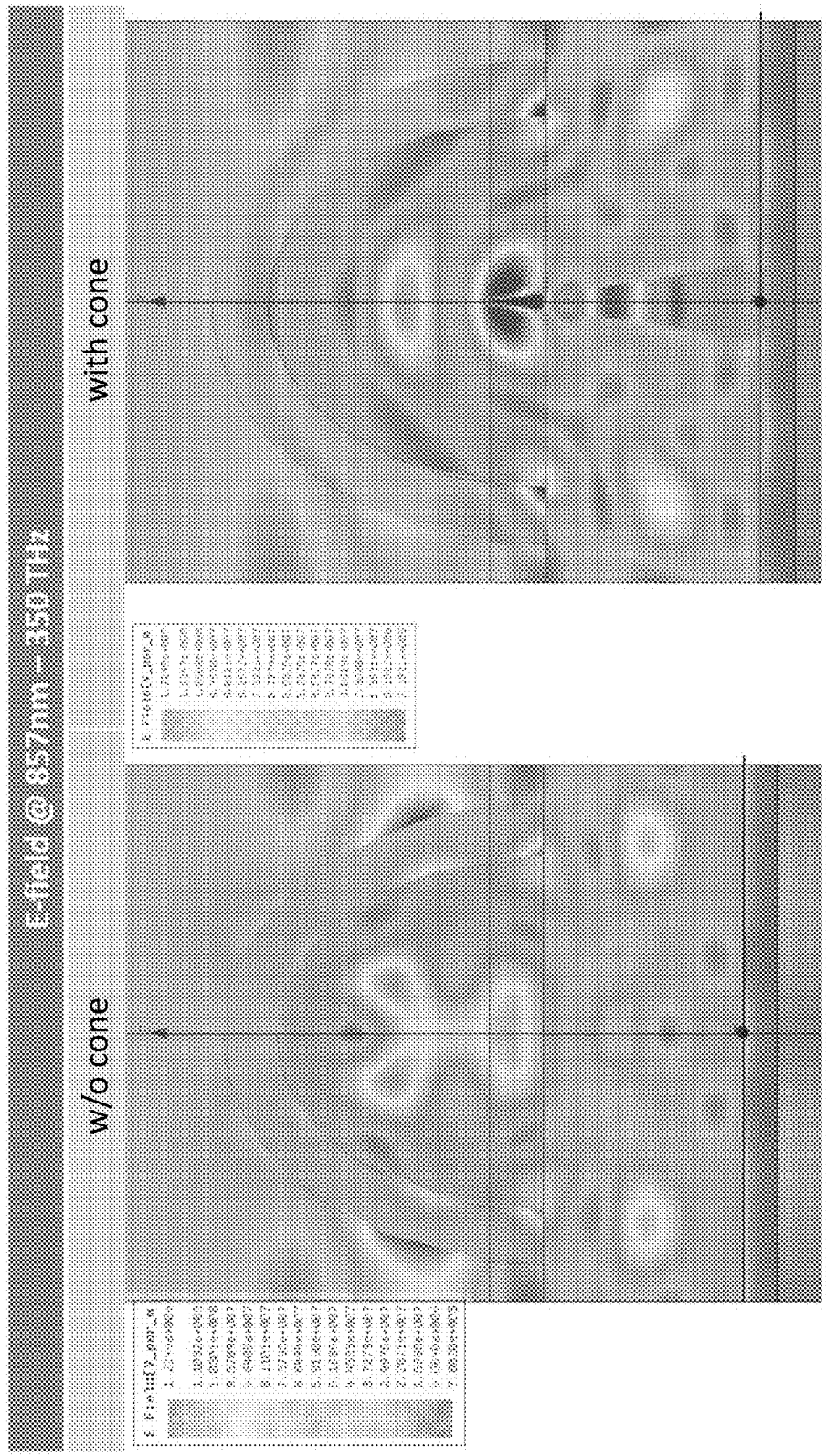
FIGS. 20(a) and 20(b) illustrate intensity distributions resulting in and around the structure of FIG. 8 with a back buffer with and without a ZnO nanoelement due to the normal impingement of sunlight (e.g., AM1.5) with a wavelength of 857 nm using a high-frequency structure simulator (HFSS) code for (a) LCCM without a cone, and (b) LCCM with a cone.

Nanoelements of various lengths, configurations, and compositions can be used to shape and position light intensity patterns, aid in collecting photocarriers, and function in separating photocarriers. The nanoelement may extend up into the dome active region as seen in FIG. 20 which uses the example of a ZnO cone nanoelement. A nanoelement may contain a semiconductor or semiconductors and one or more of a conductors (e.g., a metal, graphene), a transparent conducting material, and an insulator. It may be at least partially an organic or inorganic material; for example, the exemplary nanoelement of FIG. 16 consists of a polyimide PI core, and a 70 nm Ag coating continuous with the back Ag layer. As seen in the comparison between the nano-scale light distributions of FIGS. 20(a) and 20(b), the light concentrations present in LCCM devices at a wavelength of 857 nm for without (20(a)) and with (20(b)) a transparent conductor material (ZnO) cone-shaped nanoelement are very different. Red is the highest light and therefore photocarrier intensity concentration (in active regions); dark blue is the lowest.

Figure 21:
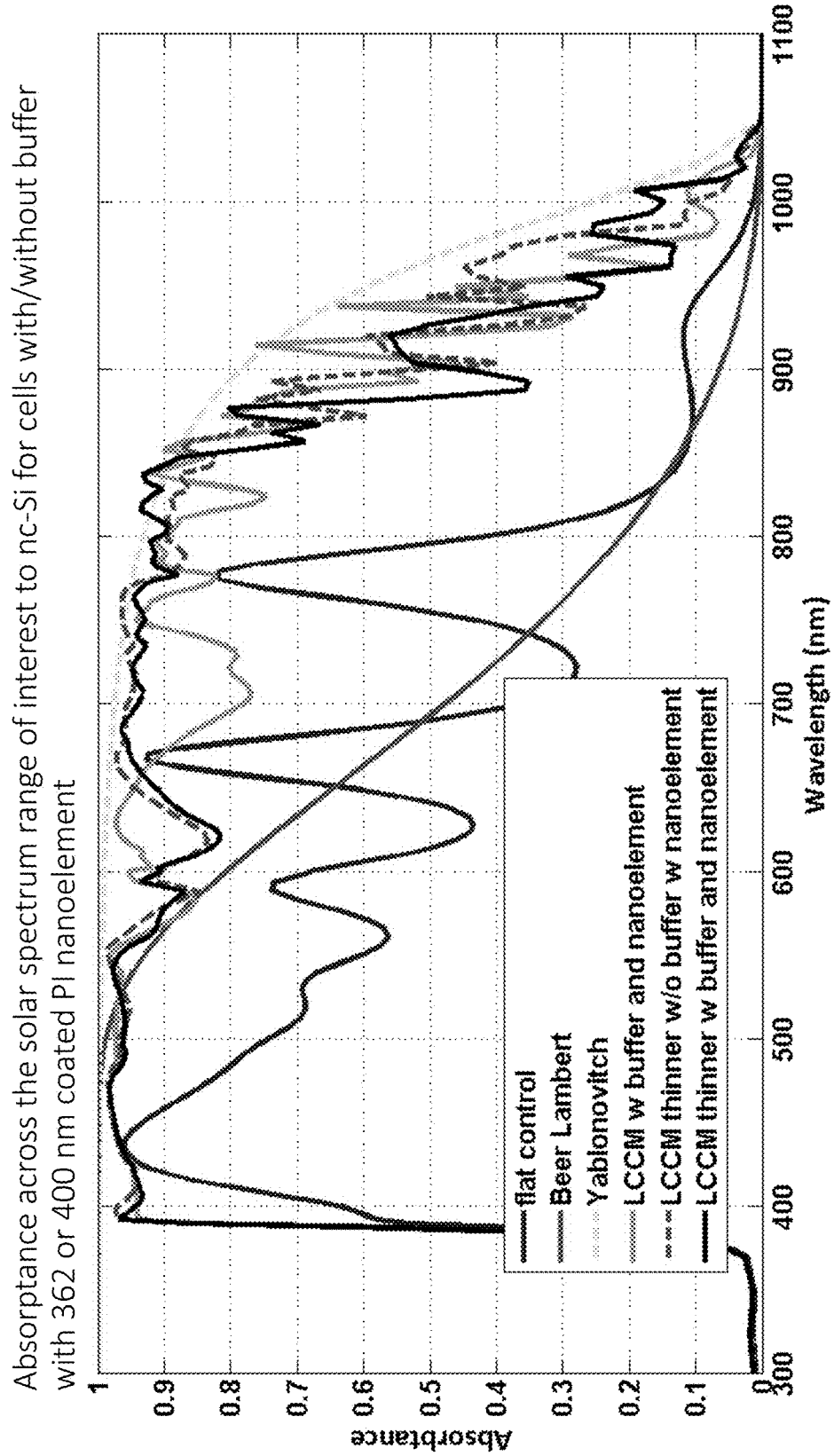
FIG. 21 is a graph of Absorptance across the solar spectrum range of interest to nc-Si for cells with/without buffer with 362 nm or 400 nm coated PI nanoelement.

The quantity of absorptance (A) as a function of wavelength for three nanoelement cases is presented in the graph shown in FIG. 21 for the solar spectrum range of interest for nc-Si. These cases are (1) a coated PI nanoelement with back layer buffer and planar region thickness of 400 nm (also plotted in FIG. 14), (2) a coated PI nanoelement without buffer and with a planar region thickness of 362 nm, and (3) a coated PI nanoelement with buffer and with planar region thickness of 362 nm. All the nanoelement cases are seen to have far superior absorptance behavior compared to the flat (FIG. 7) cell and the Beer Lambert model. At a number of wavelengths, these cases are seen to give absorptance values equal to, or exceeding, the Yablonovitch limit for the upper bound for absorptance. Compared to the two other cases, the 400 nm planar region device with a nanoelement and buffer shows excellent absorptance behavior in the about 600 to 670 nm range but poorer behavior in the about 650 to 750 nm wavelength range. Both of these features are inside the important solar cell region of the AM1.5 photon peak. This case of a nanoelement with back layer buffer and planar region thickness of 400 nm shows a number of resonances for wavelengths greater than about 800 nm and has wavelengths for which absorptance exceeds or equals the Yablonovitch limit.

A comparison of the two thinner planar active region devices of FIG. 21 with the plot for the 400 nm thick planar active region device with a nanoelement and buffer also in FIG. 21 shows there are significant differences. The thinner planar active region devices exhibit poorer behavior from about 600 to 670 nm but significantly outperform the thicker planar active region device in the 650 to 750 nm wavelength range. These observations are important since, as noted, the peak in the photon distribution in AM1.5 occurs in the 500 to 875 nm. For wavelengths about the 800 nm range, these two thinner planar-like active region devices continue to outperform the device without a nanoelement as may be seen using FIGS. 14 and 21. For wavelengths greater than about 880 nm these nanoelement containing devices also have a number of resonances while somewhat outperforming the nanoelement-less devices of FIG. 14.

As is seen in FIGS. 14 and 21, significant absorptance differences are possible between design cases resulting in performance advantages lying in different wavelength ranges for different designs. Spatially averaging the designs can be beneficial in this situation. For example, significant differences in the absorptance plots in FIG. 21 in the very important (500-875 nm) solar cell photon number peak range are seen between (1) LCCM w buffer and nanoelement configuration and (2) the LCCM thinner w buffer and nanoelement configuration.

In FIG. 21 in the very important (500-875 nm) solar cell photon number peak range are seen between the curve labeled LCCM w buffer and nanoelement and that labeled LCCM thinner w buffer and nanoelement. Each design has different wavelengths where its absorptance values excel. Such situations offer the opportunity to create an overall, enhanced solar cell absorptance obtained by spatially averaging. In the case of two curves, this averaging entails averaging the two curves. That is, for the two curves selected in this example, the $A(\lambda)$ plots at each $\lambda$ to must be average to obtain an overall enhanced absorptance. It may be noted that this spatial averaging, when based on two curves as in this example, can be achieved by alternating between the two favorable nanoelement-based designs for every dome or dome-like feature/planar-like active region/nanoelement configuration in an array. This must be done so that the array contains essentially the same number of domes or dome-like features from each design. Advantageous spatial averaging for two designs can also be achieved by creating two types of units (all of which have the same area, square shape and one of the two designs) and arranging the units in an alternating unit, square array. As a specific example, spatially averaging with the LCCM w buffer and nanoelement configuration and the LCCM thinner w buffer and nanoelement configuration of FIG. 21 results in an absorptance which is the average of each design's absorptance versus wavelength plot.

Table IV provides the solar cell short circuit current density Jsc resulting from the absorptance data calculated by HFSS for the various situations presented in the table. This Jsc assumes all the photons absorbed in the active region of the dome and the planar regions create an exciton or electron and hole that results in the collection of an electron (and consequently a hole). These resulting exemplary short circuit current density values show that as much as a 75% increases in Jsc from that yielded by the prior art control of FIG. 7 is available from the various inventive designs employed and disclosed herein.

TABLE IV

Jsc values resulting from absorptance plots

| Name | Jsc (mA/cm²) | teff (nm) | corresponding Yablonovitch limit (mA/cm²) |
|---|---|---|---|
| LCCM w buffer and nanoelement | 30.64 | 434 | 35.06 |
| LCCM w buffer w/o nanoelement | 29.52 | 472.5 | 35.26 |
| LCCM w buffer w/o nanoelement + teff | 29.61 | 434 | 35.06 |
| LCCM w thicker buffer w/o nanoelement | 29.52 | 472.5 | 35.26 |
| LCCM w/o buffer w/o nanoelement | 30.06 | 472.5 | 35.26 |
| LCCM w/o buffer w nanoelement | 31.27 | 440 | 35.1 |
| Flat cell | 18.1 | 434 | 35.06 |
| LCCM thinner w/o buffer w nanoelement | 31.5 | 400 | 34.88 |
| LCCM thinner w buffer w nanoelement | 30.96 | 393 | 34.83 |

CITED REFERENCES (1) S. Fonash, Solar Cell Device Physics, Elsevier (2010)
(2) C. Ballif, *J. Appl. Phys.* 2009, 106, 044502.
(3) V. E. Ferry, A. Polman, H. A. Atwater, *ACS Nano*. 2010, 5, 10055.
(4) Jeehwan Kim, Corsin Battaglia, Mathieu Charrière, Augustin Hong, Wooshik Jung, Hongsik Park, Christophe Ballif, and Devendra Sadana, Adv. Mater. 2014, 26, 4082.

While three exemplary embodiments have been presented in the foregoing detailed description, it should be appreciated that a vast number of variations exist. It should also be appreciated that the exemplary embodiments are only examples, and are not intended to limit the scope, applicability, or configuration of the described embodiments in any way. Rather, the foregoing detailed description will provide those skilled in the art with a convenient road map for implementing the exemplary embodiments. It should be understood that various changes can be made in the function and arrangement of elements without departing from the scope as set forth in the appended claims and the legal equivalents thereof.

The invention claimed is:

1. A photovoltaic or light detecting device comprising:
an array of dome or dome-like protrusions facing an incoming impinging light, each dome or dome-like protrusion having at its front surface a dome or dome-like electrode portion only covering a portion of a front surface of the photovoltaic or light detecting device;
each of said dome or dome-like electrode portion overlying a protrusion active region in each said dome or dome-like protrusion;
each of said dome or dome-like protrusions positioned on a planar region and arranged in a repetitive array;
a counter electrode behind said planar region and opposing the incoming impinging light;
wherein each of said protrusion active region is positioned between said dome or dome-like electrode portion and said counter electrode for the each of said protrusion active regions;
wherein each of said protrusion active regions comprises at least one absorber material and at least one junction or contact forming material;
wherein said protrusion active region has at least one selective contact or Ohmic contact forming material region at the dome or dome-like electrode portion interfacing with the protrusion active region to enable carrier collection;
said array of dome or dome-like protrusions and said planar region controlling impinging wavelengths of light at between 350 nm and 1050 nm, the positioning of the incoming light and therefore the positioning of photogeneration concentration, carrier collection, and absorptance response in said device protrusion and planar regions; and
said array of dome or dome-like protrusions in a periodic hexagonal array of spacing L which is equal to or greater than D, the diameter of each of said dome or dome-like protrusions.

2. The device of claim 1 wherein the counter electrode is configured to enhance absorptance toward the Yablonovich theoretical limit for a wavelength or wavelength range for wavelengths greater than 400 nm.

3. A method of detecting light, the method comprising:
using two different devices having the structure features of claim 1, each having the same area yet distinguished by having some different combination of varied L and D values, and therefore different absorptance behaviors;
obtaining two selected absorptances, one from each of the two arrays;

averaging the two selected absorptances to obtain a third absorptance performance as a function of wavelength, thereby producing an averaged light detection response.

4. A method of generating photovoltaic electricity, the method comprising:
using different devices having the structure features of claim 1 to absorb sunlight, each of the different devices having the same area yet distinguished by having some different combination of varied L and D values, and therefore different absorptance behaviors;
obtaining at least two selected absorptances, one from each of the different devices;
averaging the different devices two selected absorptances to obtain a distinctive absorptance performance as a function of wavelength; and
generating photovoltaic electricity from said average absorptance.

5. A method for optimizing laser-photovoltaic device light beam power transmission, the method comprising using said device of claim 1 to tailor the response of a photovoltaic device to the specific wavelength of a laser for optimizing the absorptance (power absorbed per incoming power) for the laser wavelength.

6. A method for tailoring the response of a photovoltaic light sensor, the method comprising using said device of claim 1 to tailor the response of a photovoltaic light sensor to a specific wavelength or range of wavelengths.

7. A photovoltaic or light detecting device comprising:
an array of dome or dome-like protrusions facing an incoming impinging light, each dome or dome-like protrusion being centered on a nanoelement positioned on and extending from a back layer, each of said dome or dome-like protrusions having at its front surface a dome or dome-like shaped electrode portion only covering a portion of a front surface of the photovoltaic or light detecting device;
said each dome or dome-like shaped electrode portion overlying an active region in each of the dome or dome-like protrusion;
wherein said dome or dome-like protrusions are positioned on a planar region and are arranged in a repetitive array;
a counter electrode behind said planar region and opposing the incoming impinging light;
wherein each said protrusion active region and planar region is positioned between each said dome or dome-like shaped electrode portion and said counter electrode;
wherein each of said protrusion active region and planar region comprises at least one absorber material and at least one junction or contact forming material;
wherein said protrusion active region has at least one selective contact or Ohmic contact forming material region at the dome or dome-like shaped electrode portion interface with said protrusion active region to enable carrier collection; and
said array of dome or dome-like protrusions, dome or dome-like protrusion centering nanoelements, and said planar region controlling impinging for wavelengths of light at between 350 nm and 1050 nm, the positioning of incoming light and therefore positioning of photogeneration concentration, carrier collection regions and absorptance in the protrusion and planar regions; and
said array of dome or dome-like protrusions in a periodic hexagonal array of spacing L which is equal to or greater than D, the diameter of each of said dome or dome-like protrusions.

8. The device of claim 7 wherein the counter electrode is configured to enhance absorptance toward the Yablonovich theoretical limit for a wavelength or wavelength range for wavelengths greater than 400 nm.

9. The device of claim 7 wherein each said nanoelement in each dome or dome-like protrusion is configured to enhance absorptance toward the Yablonovich theoretical limit for a wavelength or wavelength range for wavelengths greater than 400 nm.

10. The device of claim 9 wherein each said nanoelements only is in said dome or dome-like protrusion active region.

11. The device of claim 7 wherein said nanoelements in each dome or dome-like protrusion are cone-like.

12. The device of claim 7 wherein said nanoelements have rounded top cone-like shapes.

13. The device of claim 7 wherein said nanoelements in each dome or dome-like protrusion have a composition including at least one of a conductor or a semiconductor.

14. The device of claim 7 wherein said nanoelements in each dome or dome-like protrusion have a composition including an insulator.

15. The device of claim 7 wherein said nanoelement in each dome or dome-like protrusion is positioned and dimensioned to be part of said counter electrode.

16. The device of claim 7 wherein the nanoelement in each dome or dome-like protrusion has a composition and is positioned and dimensioned to reduce plasmonic loss in said counter electrode.

17. The device of claim 7 tailored for a response to a specific wavelength or range of wavelengths having said nanoelement in each dome or dome-like protrusion in the array and the photogeneration concentrations in each dome or dome-like protrusion in the array positioned so reduce at least the travel distance for one carrier.

18. The device of claim 7 having said nanoelement in each dome or dome-like protrusion in the array functioning as the counter electrode or as a part thereof thereby enhancing photocarrier separation and collection.

19. A method of detecting light, the method comprising:
using two different devices having the structure features of claim 7, each having the same area yet distinguished by having some different combination of varied L and D values and varied nanoelement features, and therefore different absorptance behaviors;
obtaining two selected absorptances, one from each of the two arrays;
averaging the two selected absorptances to obtain a third averaged absorptance performance as a function of wavelength-thereby obtaining an averaged light detection response.

20. A method for optimizing laser-photovoltaic device light beam power transmission, the method comprising using said device of claim 7 to tailor the response of a photovoltaic device to the specific wavelength of a laser for optimizing the photovoltaic response to the specific laser wavelength thereby enhancing photovoltaic device light-beam power transmission.

21. A method for tailoring the response of a photovoltaic light sensor, the method comprising using said device of claim 7 to tailor the response of a light sensor to a specific wavelength or range of wavelengths.

* * * * *